(12) United States Patent
Azuma et al.

(10) Patent No.: US 10,381,322 B1
(45) Date of Patent: Aug. 13, 2019

(54) THREE-DIMENSIONAL MEMORY DEVICE CONTAINING SELF-ALIGNED INTERLOCKING BONDED STRUCTURE AND METHOD OF MAKING THE SAME

(71) Applicant: SANDISK TECHNOLOGIES LLC, Plano, TX (US)

(72) Inventors: Yasunobu Azuma, Yokkaichi (JP); Michiaki Sano, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/960,267

(22) Filed: Apr. 23, 2018

(51) Int. Cl.
  *H01L 23/00* (2006.01)
  *H01L 25/00* (2006.01)
  (Continued)

(52) U.S. Cl.
  CPC ............ *H01L 24/80* (2013.01); *H01L 24/05* (2013.01); *H01L 24/06* (2013.01); *H01L 24/08* (2013.01);
  (Continued)

(58) Field of Classification Search
  CPC ... H01L 23/528; H01L 23/522; H01L 23/532; H01L 29/792; H01L 24/80; H01L 24/06;
  (Continued)

(56) References Cited

U.S. PATENT DOCUMENTS 3,933,550 A  1/1976  Erwin
3,933,567 A  1/1976  Erwin
(Continued)

FOREIGN PATENT DOCUMENTS

EP        1398831 A2     3/2004
WO    WO2002/015277 A2  2/2002
(Continued)

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Alexander O Williams
(74) *Attorney, Agent, or Firm* — The Marbury Law Group PLLC

(57) ABSTRACT

A first substrate has a first mesa structure that protrudes from a first bonding-side planar surface. A first metal pad structure is embedded within the first mesa structure. A second substrate has a first recess cavity that is recessed from a second bonding-side planar surface. A second metal pad structure is located at a recessed region of the first recess cavity. The first bonding-side planar surface and the second bonding-side planar surface are brought into physical contact with each other, while the first mesa structure is disposed within a volume of the first recess cavity by self-alignment. A gap is provided between the first metal pad structure and the second metal pad structure within a volume of the first recess cavity. A metal connection pad is formed by selectively growing a third metallic material from the first metal pad structure and the second metal pad structure.

11 Claims, 28 Drawing Sheets

(51) Int. Cl.
*H01L 25/18* (2006.01)
*H01L 25/065* (2006.01)

(52) U.S. Cl.
CPC .......... *H01L 24/09* (2013.01); *H01L 25/0657* (2013.01); *H01L 25/18* (2013.01); *H01L 25/50* (2013.01); *H01L 2224/0217* (2013.01); *H01L 2224/05023* (2013.01); *H01L 2224/05026* (2013.01); *H01L 2224/05083* (2013.01); *H01L 2224/05157* (2013.01); *H01L 2224/05176* (2013.01); *H01L 2224/05184* (2013.01); *H01L 2224/06102* (2013.01); *H01L 2224/0807* (2013.01); *H01L 2224/08147* (2013.01); *H01L 2224/08148* (2013.01); *H01L 2224/09103* (2013.01); *H01L 2224/80004* (2013.01); *H01L 2224/80007* (2013.01); *H01L 2224/80143* (2013.01); *H01L 2224/80345* (2013.01); *H01L 2224/80895* (2013.01); *H01L 2225/06524* (2013.01); *H01L 2225/06593* (2013.01); *H01L 2924/1426* (2013.01); *H01L 2924/14511* (2013.01)

(58) Field of Classification Search
CPC ..... H01L 24/08; H01L 24/09; H01L 25/0657; H01L 25/18; H01L 25/50; H01L 24/05; H01L 2225/06593; H01L 2224/0217; H01L 2224/05026; H01L 2224/05083; H01L 2224/05184; H01L 2224/05157; H01L 2224/05176; H01L 2224/06102; H01L 2224/0807; H01L 2224/08147; H01L 2224/08148; H01L 2224/09103; H01L 2224/80004; H01L 2224/80007; H01L 2224/80143; H01L 2224/80345; H01L 2224/80895; H01L 2224/2924; H01L 2224/1426; H01L 2924/14511; H01L 2225/06524; H01L 23/00; H01L 25/00; H01L 25/065
USPC ........................................ 257/773
See application file for complete search history.

(56) References Cited

U.S. PATENT DOCUMENTS

| | | | |
|---|---|---|---|
| 3,950,211 | A | 4/1976 | Erwin |
| 4,016,050 | A | 4/1977 | Lesh et al. |
| 4,039,244 | A | 8/1977 | Leachy |
| 4,109,297 | A | 8/1978 | Lesh et al. |
| 4,338,995 | A | 7/1982 | Shelley |
| 4,387,137 | A | 6/1983 | Rice |
| 4,425,380 | A | 1/1984 | Nuzzi et al. |
| 4,520,881 | A | 6/1985 | Phaal |
| 4,630,172 | A | 12/1986 | Stenerson et al. |
| 4,872,934 | A | 10/1989 | Kameda |
| 4,884,976 | A | 12/1989 | Franks, Jr. |
| 5,239,746 | A | 8/1993 | Goldman |
| 5,256,902 | A | 10/1993 | Culver |
| 5,371,407 | A | 12/1994 | Goldman |
| 5,387,530 | A | 2/1995 | Doyle et al. |
| 5,497,545 | A | 3/1996 | Watanabe et al. |
| 5,498,850 | A | 3/1996 | Das |
| 5,561,322 | A | 10/1996 | Wilson |
| 5,575,898 | A | 11/1996 | Wolf et al. |
| 5,656,858 | A | 8/1997 | Kondo et al. |
| 5,659,656 | A | 8/1997 | Das |
| 5,661,089 | A | 8/1997 | Wilson |
| 5,661,441 | A | 8/1997 | Morino et al. |
| 5,729,051 | A | 3/1998 | Nakamura |
| 5,737,052 | A | 4/1998 | Kimura |
| 5,747,877 | A | 5/1998 | Wilson |
| 5,767,575 | A | 6/1998 | Lan et al. |
| 5,834,839 | A | 11/1998 | Mertol |
| 5,843,806 | A | 12/1998 | Tsai |
| 5,879,568 | A | 3/1999 | Urasaki et al. |
| 5,915,167 | A | 6/1999 | Leedy |
| 6,034,427 | A | 3/2000 | Lan et al. |
| 6,084,895 | A | 7/2000 | Kouchi et al. |
| 6,172,306 | B1 | 1/2001 | Downey |
| 6,184,577 | B1 | 2/2001 | Takemura et al. |
| 6,218,731 | B1 | 4/2001 | Huang et al. |
| 6,225,139 | B1 | 5/2001 | Tsung-Wen |
| 6,280,641 | B1 | 8/2001 | Gaku et al. |
| 6,301,779 | B1 | 10/2001 | Azar |
| 6,337,463 | B1 | 1/2002 | Gaku et al. |
| 6,348,737 | B1 | 2/2002 | Advocate, Jr. et al. |
| 6,362,436 | B1 | 3/2002 | Kimbara et al. |
| 6,426,555 | B1 | 7/2002 | Hsia et al. |
| 6,479,760 | B2 | 11/2002 | Kimbara et al. |
| 6,551,433 | B2 | 4/2003 | Kuwako et al. |
| 6,566,752 | B2 | 5/2003 | Hsia et al. |
| 6,579,332 | B1 | 6/2003 | Takemura et al. |
| 6,581,816 | B2 | 6/2003 | Vitali et al. |
| 6,620,522 | B2 | 9/2003 | Kusachi et al. |
| 6,693,031 | B2 | 2/2004 | Advocate, Jr. et al. |
| 6,693,356 | B2 | 2/2004 | Jiang et al. |
| 6,740,352 | B2 | 5/2004 | Lee et al. |
| 6,750,422 | B2 | 6/2004 | Gaku et al. |
| 6,881,994 | B2 | 4/2005 | Lee et al. |
| 6,903,027 | B2 | 6/2005 | Matsuura |
| 6,929,169 | B2 | 8/2005 | Kubokawa et al. |
| 6,951,812 | B2 | 10/2005 | Jiang et al. |
| 7,005,350 | B2 | 2/2006 | Walker et al. |
| 7,023,739 | B2 | 4/2006 | Chen et al. |
| 7,067,420 | B2 | 6/2006 | Choi et al. |
| 7,078,811 | B2 | 7/2006 | Suga |
| 7,144,472 | B2 | 12/2006 | Sato et al. |
| 7,177,191 | B2 | 2/2007 | Fasoli et al. |
| 7,198,386 | B2 | 4/2007 | Zampini et al. |
| 7,208,349 | B2 | 4/2007 | Lee et al. |
| 7,217,631 | B2 | 5/2007 | Suga |
| 7,221,588 | B2 | 5/2007 | Fasoli et al. |
| 7,233,522 | B2 | 6/2007 | Chen et al. |
| 7,256,495 | B2 | 8/2007 | Lee et al. |
| 7,257,891 | B2 | 8/2007 | Lee et al. |
| 7,304,249 | B2 | 12/2007 | Lee et al. |
| 7,312,101 | B2 | 12/2007 | Jiang et al. |
| 7,329,949 | B2 | 2/2008 | Jiang et al. |
| 7,498,710 | B2 | 3/2009 | Rao |
| 7,514,321 | B2 | 4/2009 | Mokhlesi et al. |
| 7,550,847 | B2 | 6/2009 | Jiang et al. |
| 7,575,973 | B2 | 8/2009 | Mokhlesi et al. |
| 7,696,559 | B2 | 4/2010 | Arai et al. |
| 7,736,457 | B2 | 6/2010 | Iwata |
| 7,745,265 | B2 | 6/2010 | Mokhlesi et al. |
| 7,746,680 | B2 | 6/2010 | Scheuerlein et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 7,927,499 | B2 | 4/2011 | Wang |
| 8,008,710 | B2 | 8/2011 | Fukuzumi |
| 8,053,829 | B2 | 11/2011 | Kang et al. |
| 8,107,270 | B2 | 1/2012 | Scheuerlein et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,258,055 | B2 | 9/2012 | Hwang et al. |
| 8,349,716 | B2 | 3/2013 | Alsmeier et al. |
| 8,394,716 | B2 | 3/2013 | Hwang et al. |
| 8,445,347 | B2 | 5/2013 | Alsmeier |
| 8,450,181 | B2 | 5/2013 | Chen et al. |
| 8,614,126 | B1 | 12/2013 | Lee et al. |
| 8,658,499 | B2 | 2/2014 | Makala et al. |
| 8,741,761 | B2 | 6/2014 | Lee et al. |
| 8,847,302 | B2 | 9/2014 | Alsmeier et al. |
| 8,878,278 | B2 | 11/2014 | Alsmeier et al. |
| 8,884,357 | B2 | 11/2014 | Wang et al. |
| 8,946,023 | B2 | 2/2015 | Makala et al. |
| 8,987,089 | B1 | 3/2015 | Pachamuthu et al. |
| 9,023,719 | B2 | 5/2015 | Pachamuthu et al. |
| 9,129,963 | B1 | 9/2015 | Yang |
| 9,144,157 | B2 | 9/2015 | Iida |

(56) References Cited

U.S. PATENT DOCUMENTS

| | | | |
|---|---|---|---|
| 9,230,973 B2 | 1/2016 | Pachamuthu et al. |
| 9,230,987 B2 | 1/2016 | Pachamuthu et al. |
| 9,305,934 B1 | 4/2016 | Ding et al. |
| 9,412,749 B1 | 8/2016 | Shimabukuro et al. |
| 9,449,982 B2 | 9/2016 | Lu et al. |
| 9,449,983 B2 | 9/2016 | Yada et al. |
| 9,449,987 B1 | 9/2016 | Miyata et al. |
| 9,455,263 B2 | 9/2016 | Zhang et al. |
| 9,460,931 B2 | 10/2016 | Pachamuthu et al. |
| 9,502,471 B1 | 11/2016 | Lu et al. |
| 9,530,790 B1 | 12/2016 | Lu et al. |
| 9,543,318 B1 | 1/2017 | Lu et al. |
| 9,559,117 B2 | 1/2017 | Pachamuthu et al. |
| 9,576,850 B2 | 2/2017 | Ishizaka et al. |
| 9,589,981 B2 | 3/2017 | Nishikawa et al. |
| 9,620,512 B1 | 4/2017 | Nishikawa et al. |
| 9,627,403 B2 | 4/2017 | Liu et al. |
| 9,646,981 B2 | 5/2017 | Nishikawa et al. |
| RE46,435 E | 6/2017 | Scheuerlein et al. |
| 9,721,663 B1* | 8/2017 | Ogawa ............... G11C 16/0483 |
| 9,728,032 B2 | 8/2017 | Kelly et al. |
| 9,844,142 B2 | 12/2017 | Cho et al. |
| 9,853,043 B2 | 12/2017 | Lu et al. |
| 9,876,031 B1 | 1/2018 | Shimizu et al. |
| 9,953,992 B1* | 4/2018 | Ogawa ............. H01L 27/11556 |
| 10,199,359 B1* | 2/2019 | Sakakibara ......... H01L 25/0657 |
| 2001/0042781 A1 | 11/2001 | Vitali et al. |
| 2002/0003307 A1 | 1/2002 | Suga |
| 2002/0005249 A1 | 1/2002 | Kuwako et al. |
| 2002/0035890 A1 | 3/2002 | Kusachi et al. |
| 2002/0039644 A1 | 4/2002 | Kimbara et al. |
| 2002/0056890 A1 | 5/2002 | Advocate, Jr. et al. |
| 2002/0090833 A1 | 7/2002 | Matsuura et al. |
| 2002/0113044 A1 | 8/2002 | Gaku et al. |
| 2002/0149115 A1 | 10/2002 | Hsia et al. |
| 2002/0182891 A1 | 12/2002 | Matsuura |
| 2003/0068859 A1 | 4/2003 | Leung et al. |
| 2003/0107092 A1 | 6/2003 | Chevallier |
| 2003/0186543 A1 | 10/2003 | Jiang et al. |
| 2003/0219979 A1 | 11/2003 | Choi et al. |
| 2003/0232472 A1 | 12/2003 | Wu |
| 2004/0062858 A1 | 4/2004 | Sato et al. |
| 2004/0065718 A1 | 4/2004 | Kubokawa et al. |
| 2004/0132282 A1 | 7/2004 | Jiang et al. |
| 2004/0182819 A1 | 9/2004 | Gaku et al. |
| 2004/0200726 A1 | 10/2004 | Lee et al. |
| 2004/0214373 A1 | 10/2004 | Jiang et al. |
| 2004/0217093 A1 | 11/2004 | Arai et al. |
| 2005/0083698 A1 | 4/2005 | Zampini et al. |
| 2005/0127143 A1 | 6/2005 | Kubokawa et al. |
| 2005/0170626 A1 | 8/2005 | Suga |
| 2006/0003531 A1 | 1/2006 | Chang et al. |
| 2006/0030150 A1 | 2/2006 | Jiang et al. |
| 2006/0035416 A1 | 2/2006 | Savastiouk et al. |
| 2006/0076323 A1 | 4/2006 | Arai et al. |
| 2006/0258076 A1 | 11/2006 | Mizushima et al. |
| 2007/0062682 A1 | 3/2007 | Sagi et al. |
| 2007/0193679 A1 | 8/2007 | Iwata |
| 2007/0210338 A1 | 9/2007 | Orlowski |
| 2007/0228846 A1 | 10/2007 | Rao |
| 2007/0252201 A1 | 11/2007 | Kito et al. |
| 2008/0041822 A1 | 2/2008 | Wang |
| 2008/0067583 A1 | 3/2008 | Kidoh et al. |
| 2008/0099917 A1 | 5/2008 | Jiang et al. |
| 2008/0132006 A1 | 6/2008 | Jiang et al. |
| 2008/0169496 A1 | 7/2008 | Keller et al. |
| 2009/0121323 A1 | 5/2009 | Kwon et al. |
| 2009/0230449 A1 | 9/2009 | Sakaguchi et al. |
| 2009/0242967 A1 | 10/2009 | Katsumata et al. |
| 2010/0044778 A1 | 2/2010 | Seol |
| 2010/0059811 A1 | 3/2010 | Sekine et al. |
| 2010/0065949 A1 | 3/2010 | Thies et al. |
| 2010/0112769 A1 | 5/2010 | Son et al. |
| 2010/0117143 A1 | 5/2010 | Lee et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0171162 A1 | 7/2010 | Katsumata et al. |
| 2010/0181610 A1 | 7/2010 | Kim et al. |
| 2010/0207195 A1 | 8/2010 | Fukuzumi et al. |
| 2010/0213458 A1 | 8/2010 | Prall |
| 2010/0320528 A1 | 12/2010 | Jeong et al. |
| 2011/0065270 A1 | 3/2011 | Shim |
| 2011/0076819 A1 | 3/2011 | Kim et al. |
| 2011/0133606 A1 | 6/2011 | Yoshida et al. |
| 2011/0151667 A1 | 6/2011 | Hwang et al. |
| 2011/0169067 A1 | 7/2011 | Ernst et al. |
| 2011/0266606 A1 | 11/2011 | Park et al. |
| 2011/0287612 A1 | 11/2011 | Lee et al. |
| 2011/0298126 A1 | 12/2011 | Tsai et al. |
| 2011/0312174 A1 | 12/2011 | Lee et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0003800 A1 | 1/2012 | Lee et al. |
| 2012/0007230 A1 | 1/2012 | Hwang et al. |
| 2012/0012920 A1 | 1/2012 | Shin et al. |
| 2012/0032250 A1 | 2/2012 | Son et al. |
| 2012/0052674 A1 | 3/2012 | Lee et al. |
| 2012/0068242 A1 | 3/2012 | Shin et al. |
| 2012/0074367 A1 | 3/2012 | Costa et al. |
| 2012/0119287 A1 | 5/2012 | Park et al. |
| 2012/0140562 A1 | 6/2012 | Choe et al. |
| 2012/0153376 A1 | 6/2012 | Alsmeier et al. |
| 2012/0168220 A1 | 7/2012 | Lee et al. |
| 2012/0208347 A1 | 8/2012 | Hwang et al. |
| 2012/0256247 A1 | 10/2012 | Alsmeier et al. |
| 2012/0261638 A1 | 10/2012 | Sills et al. |
| 2012/0276719 A1 | 11/2012 | Han et al. |
| 2013/0118782 A1 | 5/2013 | Cho et al. |
| 2013/0161702 A1 | 6/2013 | Chen |
| 2013/0213701 A1 | 8/2013 | Iida |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2013/0313717 A1 | 11/2013 | Holmes et al. |
| 2013/0322174 A1 | 12/2013 | Li et al. |
| 2014/0061849 A1 | 3/2014 | Tanzawa |
| 2014/0124475 A1 | 5/2014 | Lee |
| 2014/0199815 A1 | 7/2014 | Hwang et al. |
| 2014/0264533 A1 | 9/2014 | Simsek-Ege et al. |
| 2014/0264542 A1 | 9/2014 | Simsek-Ege et al. |
| 2014/0264545 A1 | 9/2014 | Takahashi et al. |
| 2014/0273373 A1 | 9/2014 | Makala et al. |
| 2014/0377947 A1 | 12/2014 | Ishizaka et al. |
| 2015/0003158 A1 | 1/2015 | Aritome |
| 2015/0236038 A1 | 8/2015 | Pachamuthu et al. |
| 2016/0027760 A1 | 1/2016 | Yu et al. |
| 2016/0049421 A1 | 2/2016 | Zhang et al. |
| 2016/0320142 A1 | 11/2016 | Ho et al. |
| 2017/0200671 A1 | 7/2017 | Tsai et al. |
| 2017/0236835 A1 | 8/2017 | Nakamura et al. |
| 2017/0373079 A1 | 12/2017 | Sharangpani et al. |
| 2017/0373197 A1 | 12/2017 | Sharangpani et al. |
| 2018/0342455 A1* | 11/2018 | Nosho ................... H01L 23/528 |
| 2018/0350879 A1* | 12/2018 | Sel ....................... H01L 27/2481 |
| 2018/0366482 A1* | 12/2018 | Zhou .................. H01L 27/11556 |
| 2019/0006418 A1* | 1/2019 | Sel ........................ H01L 27/249 |
| 2019/0027489 A1* | 1/2019 | Orimoto ............. H01L 23/5226 |
| 2019/0057756 A1* | 2/2019 | Kim ...................... G11C 29/025 |
| 2019/0067025 A1* | 2/2019 | Yada ................... H01L 21/30608 |
| 2019/0067314 A1* | 2/2019 | Lu ..................... H01L 27/11575 |

FOREIGN PATENT DOCUMENTS

| | | | |
|---|---|---|---|
| WO | WO2008/118433 A1 | 10/2008 |
| WO | WO2009/085078 A1 | 7/2009 |

(56) References Cited

FOREIGN PATENT DOCUMENTS

WO WO2012/003301 A2 1/2012
WO WO2015/012664 A1 8/2015

OTHER PUBLICATIONS

Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Kimura, "3D Cells Make Terabit NAND Flash Possible," Nikkei Electronics Asia, Sep. 17, 2009, 6pgs.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeip.co.jp/english/NEWS_EN/20090619/171977/ Nikkei Microdevices, Tech-On, Jun. 19, 2009.
Li, W. et al., "Sacrificial Polymers for Nanofluidic Channels in Biological Applications", Nanotechnology 14 (2003) 578-583.
International Search Report & Written Opinion, PCT/US2011/042566, dated Jan. 17, 2012.
Invitation to Pay Additional Fees & Partial International Search Report, PCT/US2011/042566, dated Sep. 28, 2011.
International Search Report, PCT/US2013/035567, dated Sep. 30, 2013, 6pgs.
International Search Report, PCT/US2016/036656, dated Nov. 10, 2016, 17pgs.
Invitation to Pay Additional Fees and Partial Search Report, PCT/US2016/036656, dated Sep. 16, 2016, 7pgs.
Notice of Allowance, U.S. Appl. No. 14/995,017, dated May 20, 2016, 14pgs.
Invitation to Pay Additional Fees, PCT/US2013/024638, dated Apr. 24, 2013.
International Search Report and Written Opinion, PCT/US2014/020290, dated Jun. 25, 2014, 10pgs.
International Search Report and Written Opinion, PCT/US2014/023276, dated Jun. 30, 2014, 13pgs.
Invitation to Pay Additional Fees and Partial Search Report, PCT/US2015/015155, dated May 25, 2015, 8pgs.
U.S. Appl. No. 15/638,672, filed Jun. 30, 2017, SanDisk Technologies LLC.
U.S. Appl. No. 15/458,200, filed Mar. 14, 2017, SanDisk Technologies LLC.
U.S. Appl. No. 15/458,269, filed Mar. 14, 2017, SanDisk Technologies LLC.
U.S. Appl. No. 15/458,272, filed Mar. 14, 2017, SanDisk Technologies LLC.
U.S. Appl. No. 15/581,575, filed Apr. 28, 2017, SanDisk Technologies LLC.
U.S. Appl. No. 15/593,916, filed May 12, 2017, SanDisk Technologies LLC.
U.S. Appl. No. 15/605,204, filed May 25, 2017, SanDisk Technologies LLC.
U.S. Appl. No. 15/873,101, filed Jan. 17, 2018, SanDisk Technologies LLC.
U.S. Appl. No. 15/892,648, filed Feb. 9, 2018, SanDisk Technologies LLC.
U.S. Appl. No. 15/928,337, filed Mar. 22, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
Notification of Transmittal of the International Search Report and Written Opinion of the International Searching Authority for International Patent Application No. PCT/US2019/016152, dated May 15, 2019, 2 pages.
International Search Report The International Searching Authority for International Patent Application No. PCT/US2019/016152, dated May 15, 2019, 3 pages.
Written Opinion of the International Searching Authority for International Patent Application No. PCT/US2019/016152, dated May 15, 2019, 7 pages.

* cited by examiner

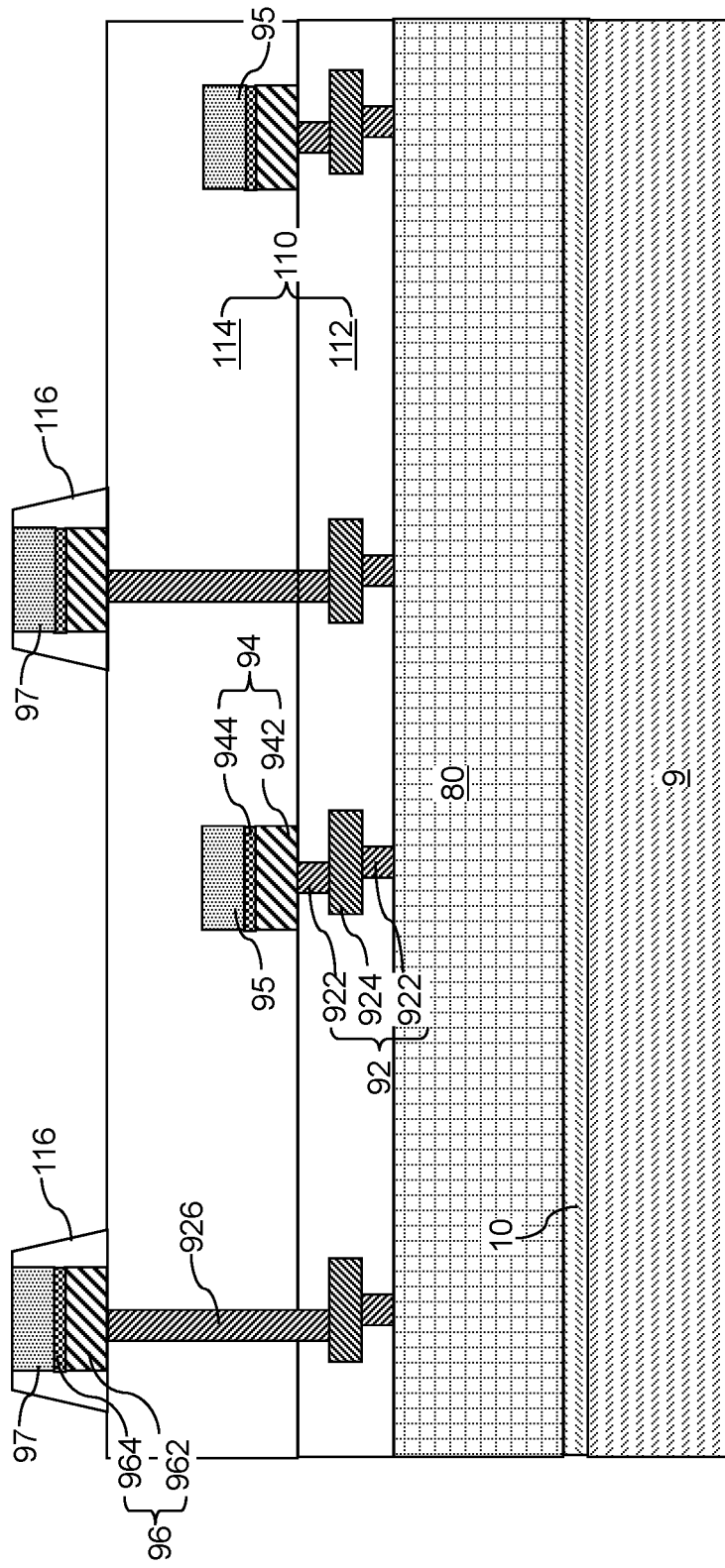

ically material from the first metal pad structure and
the second metal pad structure.

THREE-DIMENSIONAL MEMORY DEVICE CONTAINING SELF-ALIGNED INTERLOCKING BONDED STRUCTURE AND METHOD OF MAKING THE SAME

FIELD

The present disclosure relates generally to the field of semiconductor devices, and particular to a three-dimensional memory device containing self-aligned interlocking bonded structures including matching pairs of protrusions and recesses and methods of manufacturing the same.

BACKGROUND

Prior art substrates can be bonded by bonding two sets of copper bonding pads located on opposing pair of substrates. The opposing pair of substrates should be aligned during the bonding process to provide electrical connection between electrical nodes in the two substrates. Misalignment of the bonding pads can result in a decreased product yield in the bonded structures.

SUMMARY

According to an aspect of the present disclosure, a bonded structure is provided, which comprises: a first substrate having a first bonding-side planar surface and a first mesa structure that protrudes from the first bonding-side planar surface, wherein a first metal pad structure comprising a first metallic material and including a first metallic surface is embedded within the first mesa structure; a second substrate having a second bonding-side planar surface and a first recess cavity that is recessed from the second bonding-side planar surface, wherein a second metal pad structure comprising a second metallic material and including a second metallic surface is located at a recessed region of the first recess cavity, and the first mesa structure is disposed within a volume of the first recess cavity and the first bonding-side planar surface contacts the second bonding-side planar surface; and a metal connection pad comprising a third metallic material bonded to the first metal pad structure and the second metal pad structure, and located within a volume of the first recess cavity that is not filled by the first mesa structure.

According to another aspect of the present disclosure, a method of forming a bonded structure is provided, which comprises: providing a first substrate having a first bonding-side planar surface and a first mesa structure that protrudes from the first bonding-side planar surface, wherein a first metal pad structure comprising a first metallic material and including a first metallic surface is embedded within the first mesa structure; providing a second substrate having a second bonding-side planar surface and a first recess cavity that is recessed from the second bonding-side planar surface, wherein a second metal pad structure comprising a second metallic material and including a second metallic surface is located at a recessed region of the first recess cavity; bringing the first bonding-side planar surface and the second bonding-side planar surface into physical contact with each other, while disposing the first mesa structure within a volume of the first recess cavity, wherein a gap is provided between the first metal pad structure and the second metal pad structure within a volume of the first recess cavity; and forming a metal connection pad by selectively growing a third metallic material from the first metal pad structure and the second metal pad structure.

BRIEF DESCRIPTION OF THE DRAWINGS

FIG. 6A is a vertical cross-sectional view of the first exemplary semiconductor structure after patterning the planarization insulating layer into insulating ring structures that form mesa structures according to an embodiment of the present disclosure.

DETAILED DESCRIPTION

Figure 1A:
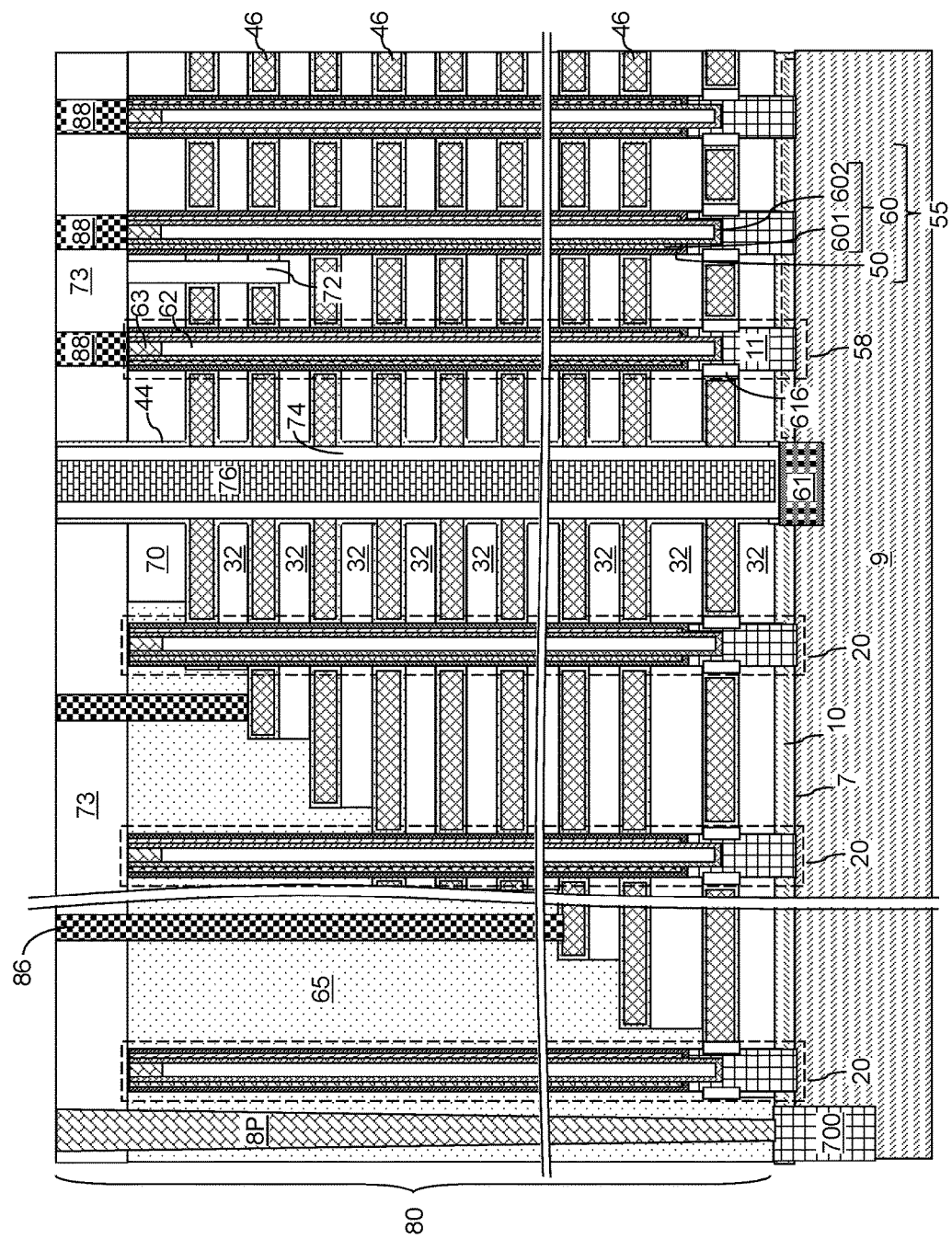
FIG. 1A is a schematic vertical cross-sectional view of an exemplary three-dimensional memory device including a three-dimensional memory array according to an embodiment of the present disclosure.

As discussed above, the present disclosure is directed to self-aligned interlocking bonded structures including matching pairs of protrusions and recesses and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the embodiments of the present disclosure can include monolithic three-dimensional NAND memory devices assembled non-monolithically by substrate to substrate bonding.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Figure 1B:
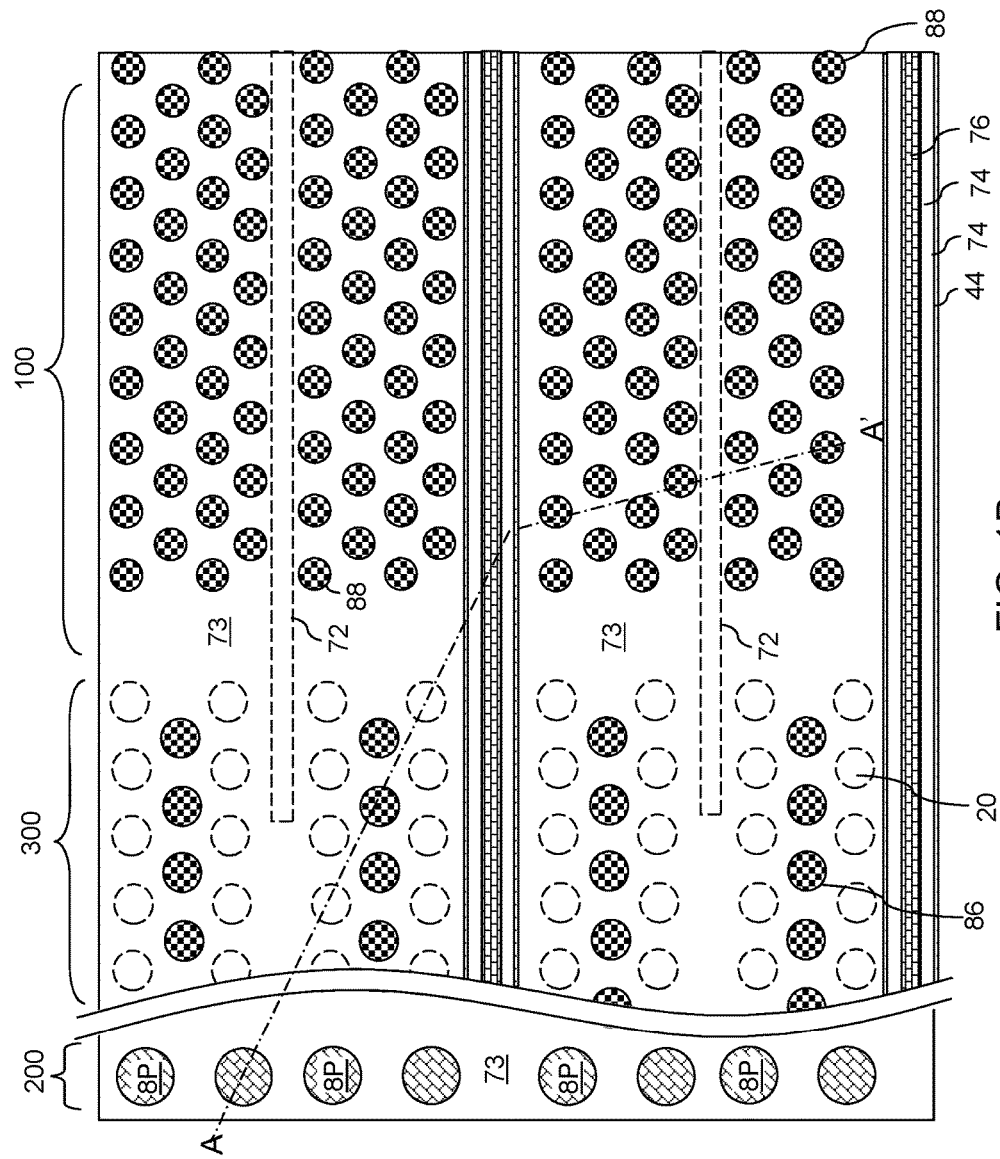
FIG. 1B is a top-down view of the exemplary three-dimensional memory device of FIG. 1A.

A non-limiting example of a three-dimensional memory device 80 that can be included in a semiconductor die is illustrated in FIGS. 1A and 1B. While the three-dimensional memory device 80 illustrated in FIGS. 1A and 1B include vertical NAND memory devices, the memory devices that can be employed for the semiconductor chips employed in the chip assembly structures of the present disclosure include other memory devices such as NOR memory devices, SRAM's, DRAM's, ReRAM memory devices (including phase change memory devices), spin torque memory devices, or any other memory device that can be packaged in a semiconductor chip. Further, semiconductor chips including logic devices, such as a processor chip, can be employed for the chip assembly structures of the present disclosure.

The three-dimensional memory device 80 illustrated in FIGS. 1A and 1B includes a substrate (9, 10), which can be a semiconductor substrate. The substrate (9, 10) can include a substrate semiconductor layer 9 that is provided as a semiconductor wafer, such as a silicon wafer, and an optional semiconductor material layer 10 that is formed on the upper surface 7 of the substrate semiconductor layer 9. Optional semiconductor devices 700 such as field effect transistors (e.g., CMOS devices) can be formed on the semiconductor substrate to provide a peripheral circuit (e.g., driver circuit) for controlling operation of the three-dimensional memory device 80 provided in the memory array region 100. The region of the semiconductor devices 700 is referred to as a peripheral device region 200. Alternatively, the semiconductor devices 700 can be omitted, and the entire peripheral (e.g., driver) circuit can be bonded to the memory device as will be described below. An alternating stack of insulating layers 32 and spacer material layers are formed over the substrate (9, 10). The spacer material layers are formed as, or are subsequently replaced with, electrically conductive layers 46, which function as word lines/control gate electrodes and select gate electrodes of the NAND memory device. An insulating cap layer 70 can be formed over the alternating stack (32, 46).

A staircase region can be formed in the contact region 300 by patterning the alternating stack (32, 46) such that underlying layers extend farther than overlying layers. A retro-stepped dielectric material portion 65 can be formed over the stepped surfaces of the alternating stack (32, 46) in the staircase region. Memory openings can be formed in the array region 100 and support openings can be formed in the contact region 300 by an anisotropic etch employing an etch mask layer. Memory opening fill structures 58 can be formed in each memory opening, and support pillar structures 20 can be formed in each support opening. The memory opening fill structures 58 and the support pillar structures 20 can include a same set of structural elements have a same composition. For example, each of the memory opening fill structures 58 and the support pillar structures 20 can include an optional pedestal channel portion 11, a memory stack structure 55, an optional dielectric core 62, and a drain region 63. Each memory stack structure 55 can include a memory film 50 and a semiconductor channel 60. Each memory film 50 can include a layer stack of, from outside to inside, a blocking dielectric layer, a vertical stack of memory elements (which may be embodied, for example, as portions of a charge storage material layer located at levels of the electrically conductive layers 46), and a tunneling dielectric layer. Each semiconductor channel 60 can include a first semiconductor channel layer 601 and a second semiconductor channel layer 602. Optionally, drain-select-level shallow trench isolation structures 72 can be formed through a subset of layers in an upper portion of the alternating stack (32, 46). The electrically conductive layers 46 that are cut by the drain-select-level shallow trench isolation structures 72 correspond to the drain-select gate electrodes of the NAND memory device. The drain-select-level shallow trench isolation structures 72 include a dielectric material such as silicon oxide, located in a trench.

A contact level dielectric layer 73 can be formed over the alternating stack (32, 46). If the spacer material layers are provided as sacrificial material layers, backside trenches can be formed between groups of memory opening fill structures 58 to facilitate replacement of the sacrificial material layers with electrically conductive layers 46. Backside recesses can be formed by introducing into the backside trenches an isotropic etchant that etches the material of the sacrificial material layers selective to the insulating layers 32, the memory opening fill structures 58, and the support pillar structures 20. Removal of the sacrificial material layers forms backside recesses that laterally surround the memory opening fill structures 58 and the support pillar structures 20. Tubular insulating spacers 616 can be formed around the pedestal channel portions 11, for example, by oxidation of the semiconductor material of the pedestal channel portions 11. Backside blocking dielectric layers 44 and the electrically conductive layers 46 can be formed in the backside recesses.

Source regions 61 can be formed in the semiconductor material layer 10 underneath the backside trenches, for example, by ion implantation. Surface regions of the semiconductor material layer 10 between the pedestal channel portions 11 and the source regions 61 constitute horizontal semiconductor channels 59. Insulating spacers 74 and backside contact via structures 76 can be formed in the backside trenches. Additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63 to electrically connect the drain regions 63 to overlying bit lines (not shown). Word line contact via structures 86 can be formed on the electrically conductive layers 46 through the contact level dielectric layer 73 and the retro-stepped dielectric material portion 65. Peripheral device contact via structures 8P can be formed through the contact level dielectric layer 73 and the retro-stepped dielectric material portion 65 directly on respective nodes of the peripheral devices. Additional interconnect level dielectric material layers (not shown) and additional metal interconnect structures (not shown) can be formed. The collection of all device structures and all interconnect structures on, or above, the substrate (9, 10) up to the level of the additional interconnect level dielectric material layers is herein referred to as a semiconductor device assembly 800.

It should be noted that the semiconductor device assembly 800 illustrated in FIGS. 1A and 1B is only illustrative. Any semiconductor device assembly 800 including a substrate, semiconductor device thereupon, metal interconnect structures providing electrical contact among the semiconductor devices, and interconnect level dielectric layers embedding the metal interconnect structures can be employed for the purpose of implementing embodiments of the present disclosure.

Figure 2A:
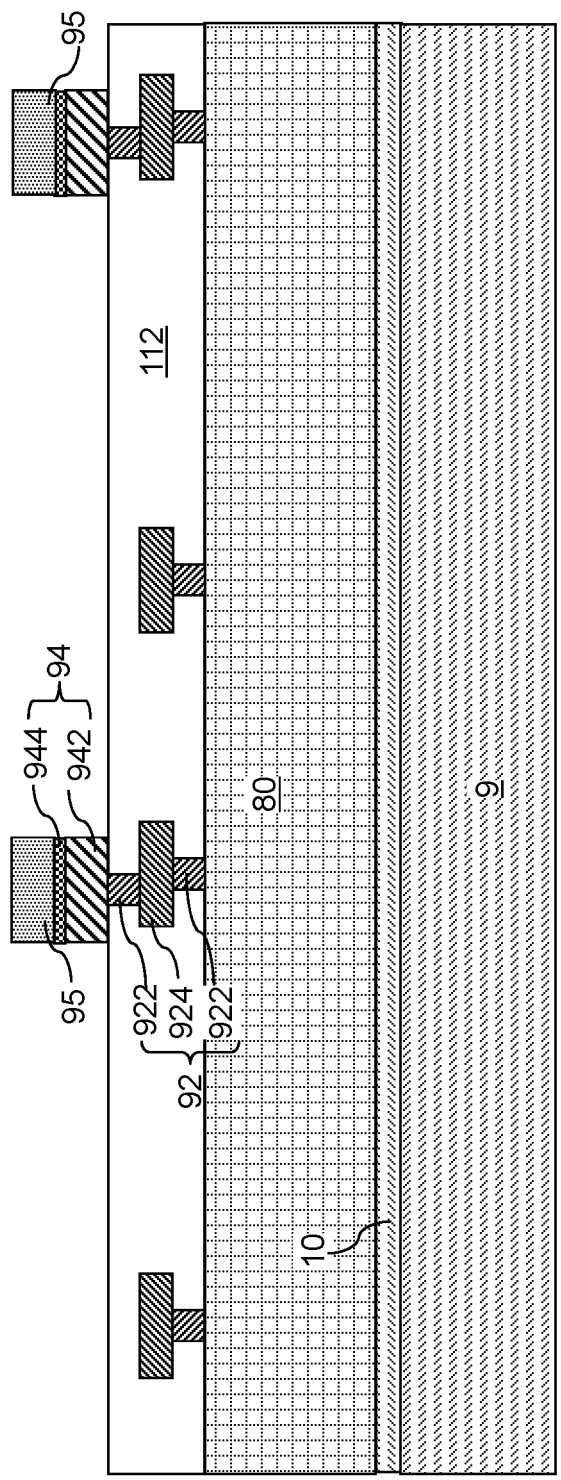
FIG. 2A is a vertical cross-sectional view of a first exemplary semiconductor structure that may incorporate the exemplary three-dimensional memory device of FIGS. 1A and 1B after formation of interconnect level dielectric layers and pad stacks of lower metal pad structures and lower sacrificial pad structures according to an embodiment of the present disclosure.
Figure 2B:
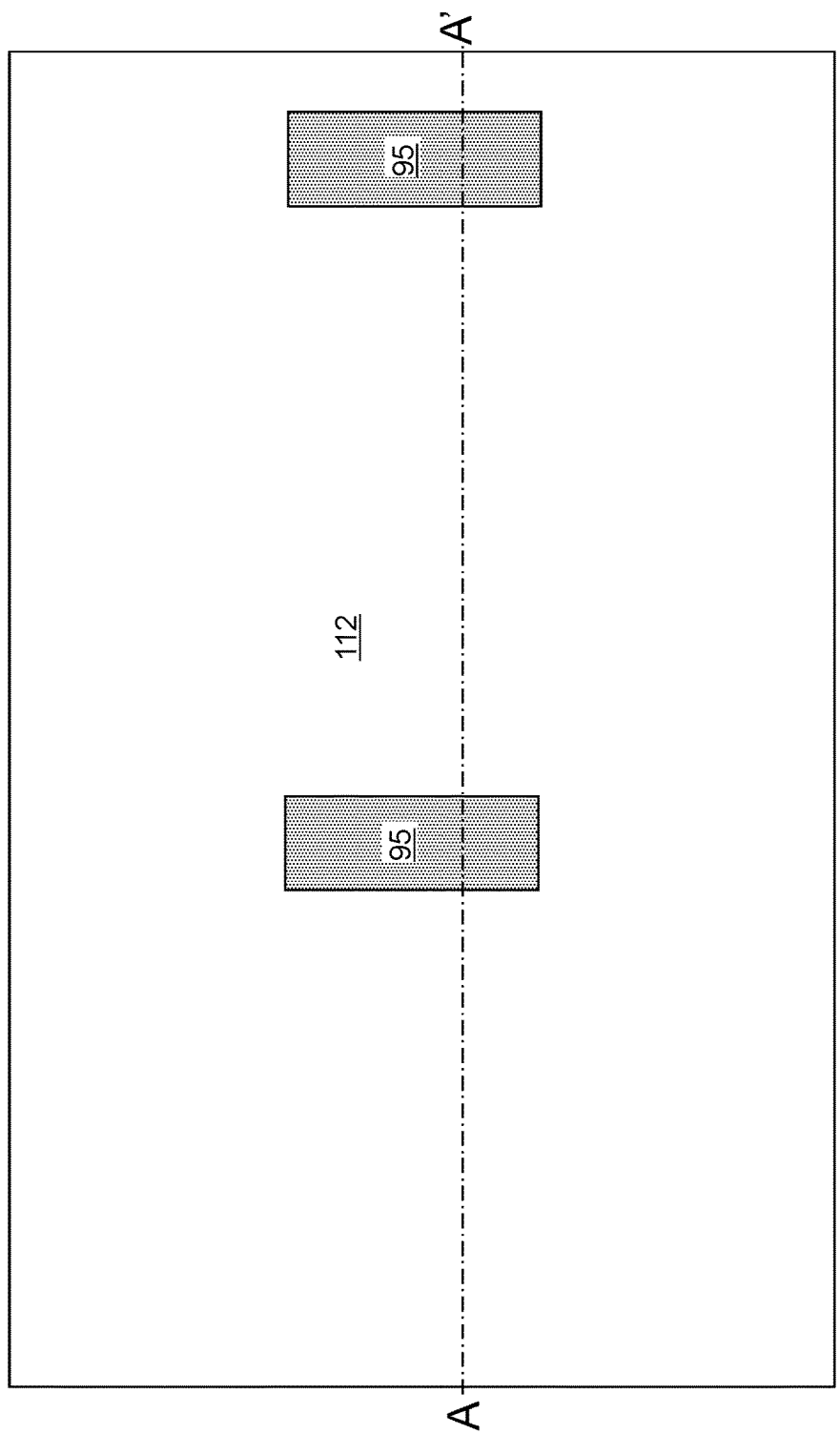
FIG. 2B is a top-down view of the first exemplary semiconductor structure of FIG. 2A.

Referring to FIGS. 2A and 2B, a first exemplary semiconductor structure is illustrated, which can incorporate the exemplary three-dimensional memory device 80 of FIGS. 1A and 1B. Multiple instance of the first exemplary semiconductor structure can be manufactured simultaneously or sequentially to implement embodiments of the present disclosure.

The three-dimensional memory device 80 includes a three-dimensional array of memory elements included in a two-dimensional array of memory stack structures 55. Interconnect level dielectric layers 112 can be formed over the exemplary three-dimensional memory device 80. The interconnect level dielectric layers 112 can include various dielectric material layers, which can include at least one via level dielectric material layer and at least one line level dielectric material layer. Metal interconnect structures 92 are formed in the interconnect level dielectric layer 112. The metal interconnect structures 92 comprise metal via structures 922 and metal line structures 924. The topmost surface of the interconnect level dielectric layers 112 can be a planar horizontal surface.

Lower pad stacks (94, 95) of lower metal pad structures 94 and lower sacrificial pad structures 95 can be formed over the interconnect level dielectric layers 112. A layer stack of at least one metallic material layer including a respective metallic material and a sacrificial material layer including a sacrificial material can be formed over the interconnect level dielectric layers 112, and can be subsequently patterned to form the lower pad stacks (94, 95). For example, a metal layer, a metal nitride liner, and a sacrificial material layer can be sequentially deposited over the interconnect level dielectric layers 112, and can be patterned by a combination of lithographic patterning steps and an etch process to form the lower pad stacks (94, 95). The lithographic patterning steps can form a patterned photoresist layer covering discrete areas of the sacrificial material layer, and the etch process can include an anisotropic etch process that sequentially etches physically exposed portions of the sacrificial material layer, the metallic liner layer, and the metal layer.

Each remaining portion of the sacrificial material layer constitutes a lower sacrificial pad structure 95. Each remaining portion of the metal nitride liner constitutes a lower metal nitride portion 944. Each remaining portion of the metal layer constitutes a lower metal portion 942. Each stack of a lower metal portion 942 and a lower metal nitride portion 944 constitutes a lower metal pad structure 94. A lower metal pad structure 94 and a lower sacrificial pad structure 95 can have vertically coincident sidewalls. As used herein, a first surface and a second surface are vertically coincident with each other if the second surface overlies the first surface and if there exists a two-dimensional plane that includes the first surface and the second surface. Each lower metal pad structure 94 is electrically shorted to a respective node of the three-dimensional memory device 80.

The lower metal portions 942 can include, and/or consist essentially of, at least one elemental metal. For example, the lower metal portions 942 can include copper, tungsten, cobalt, aluminum, and/or elemental metals. The thickness of the lower metal portions 942 can be in a range from 30 nm to 600 nm, although lesser and greater thicknesses can also be employed. The lower metal nitride portions 944 can include, and/or consist essentially of, at least one conductive metal nitride such as titanium nitride, tantalum nitride, and/or tungsten nitride. The thickness of the lower metal nitride portions 944 can be in a range from 3 nm to 60 nm, although lesser and greater thicknesses can also be employed. The lower sacrificial pad portions 95 can include a material that can be removed selective to silicon oxide and the materials of the lower metal portions 942 and the lower metal nitride portions 944. For example, the lower sacrificial pad portions 95 can include silicon nitride, amorphous silicon, polysilicon, germanium, or a silicon germanium alloy. In one embodiment, the lower sacrificial pad structures 95 can include silicon nitride. The thickness of the lower sacrificial pad portions 95 can be in a range from 30 nm to 600 nm, although lesser and greater thicknesses can also be employed.

Horizontal cross-sectional shapes of the lower pad stacks (94, 95) (which can be observed in a top-down view) may be polygonal, curved, or of any generally curvilinear closed two-dimensional shape. For example, the horizontal cross-sectional shapes of the lower pad stacks (94, 95) can be rectangular, triangular, pentagonal, hexagonal, heptagonal, octagonal, circular, elliptical, or can have a two-dimensional closed shape having at least one straight edge and/or at least one curved edge. The maximum lateral dimension for each lower pad stack (94, 95) can be in a range from 100 nm to 20,000 nm, such as from 500 nm to 10,000 nm, although lesser and greater maximum lateral dimensional can also be employed.

Figure 3A:
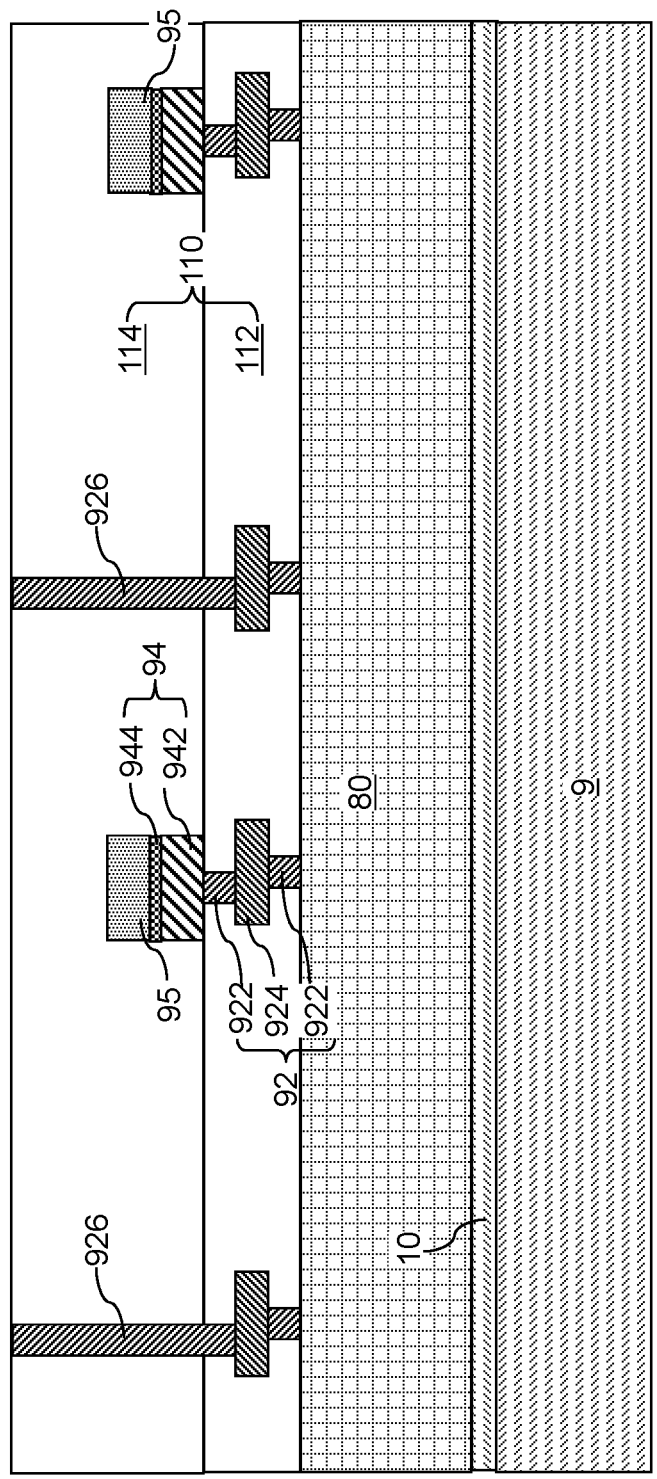
FIG. 3A is a vertical cross-sectional view of the first exemplary semiconductor structure after formation of a bonding level dielectric layer and bonding level via structures according to an embodiment of the present disclosure.
Figure 3B:
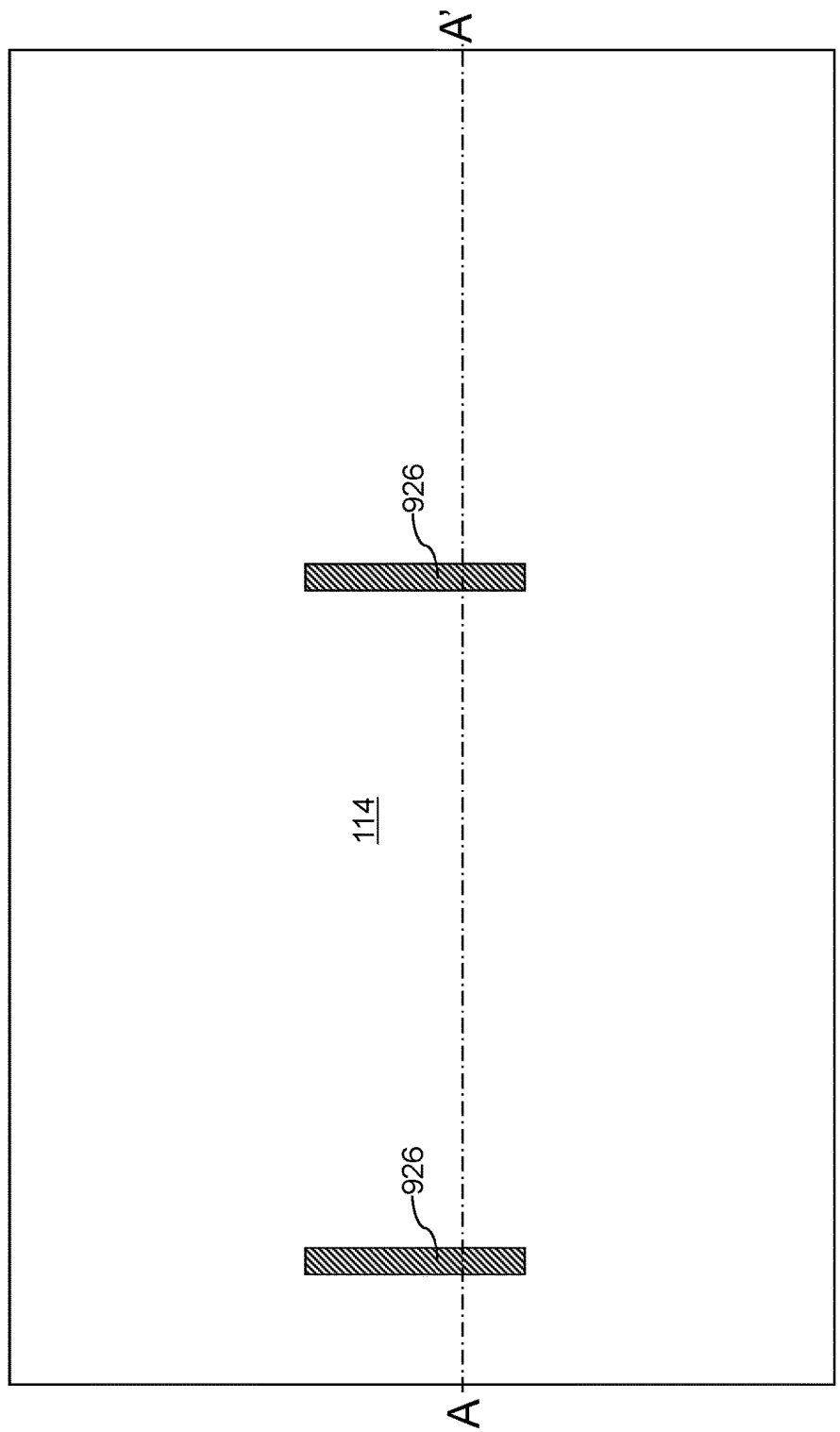
FIG. 3B is a top-down view of the first exemplary semiconductor structure of FIG. 3A.

Referring to FIGS. 3A and 3B, a bonding level dielectric layer 114 is formed over the interconnect level dielectric layer 112. The bonding level dielectric layer 114 can include silicon oxide such as undoped silicate glass or doped silicate glass. The thickness of the bonding level dielectric layer 114 is greater than the thickness of the lower pad stacks (94, 95). The bonding level dielectric layer 114 can be planarized (for example, by chemical mechanical planarization) to provide a planar top surface, or may be formed by a self-planarizing deposition method (such as spin-coating). The stack of the interconnect level dielectric layer 112 and the bonding level dielectric layer 114 is referred to as a dielectric capping layer 110, which caps the three-dimensional memory device 80 and embeds various metal interconnect structures 92 therein. Additional metal via structures can be formed through the bonding level dielectric layer 114 to contact an underlying metal interconnect structure 92. The additional metal via structures are herein referred to as bonding level via structures 926. The bonding level via structures 926 can have vertical or substantially vertical sidewalls, and may have generally cylindrical shapes. Each bonding level via structure 926 can be electrically shorted to a respective node of the three-dimensional memory device 80.

Figure 4A:
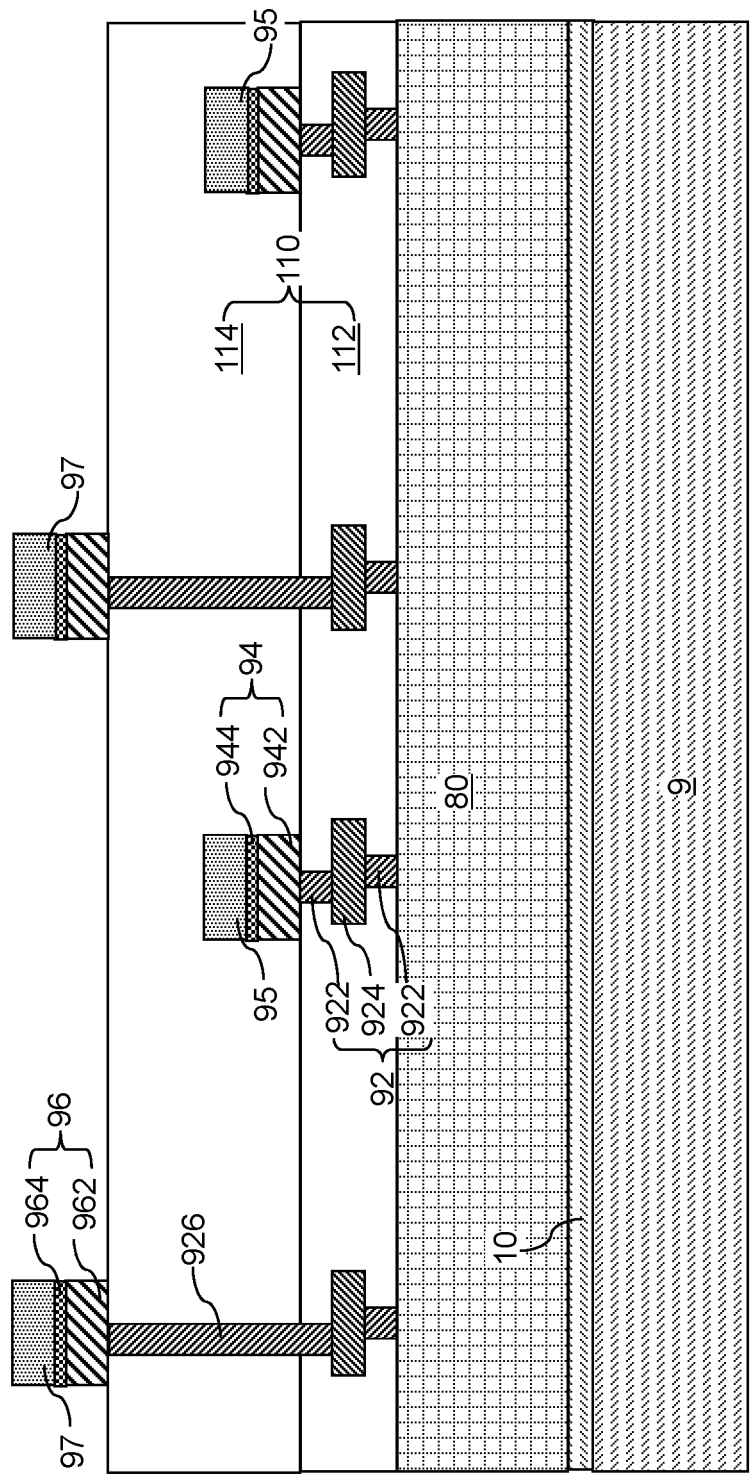
FIG. 4A is a vertical cross-sectional view of the first exemplary semiconductor structure after formation of pad stacks of upper metal pad structures and upper sacrificial pad structures according to an embodiment of the present disclosure.
Figure 4B:
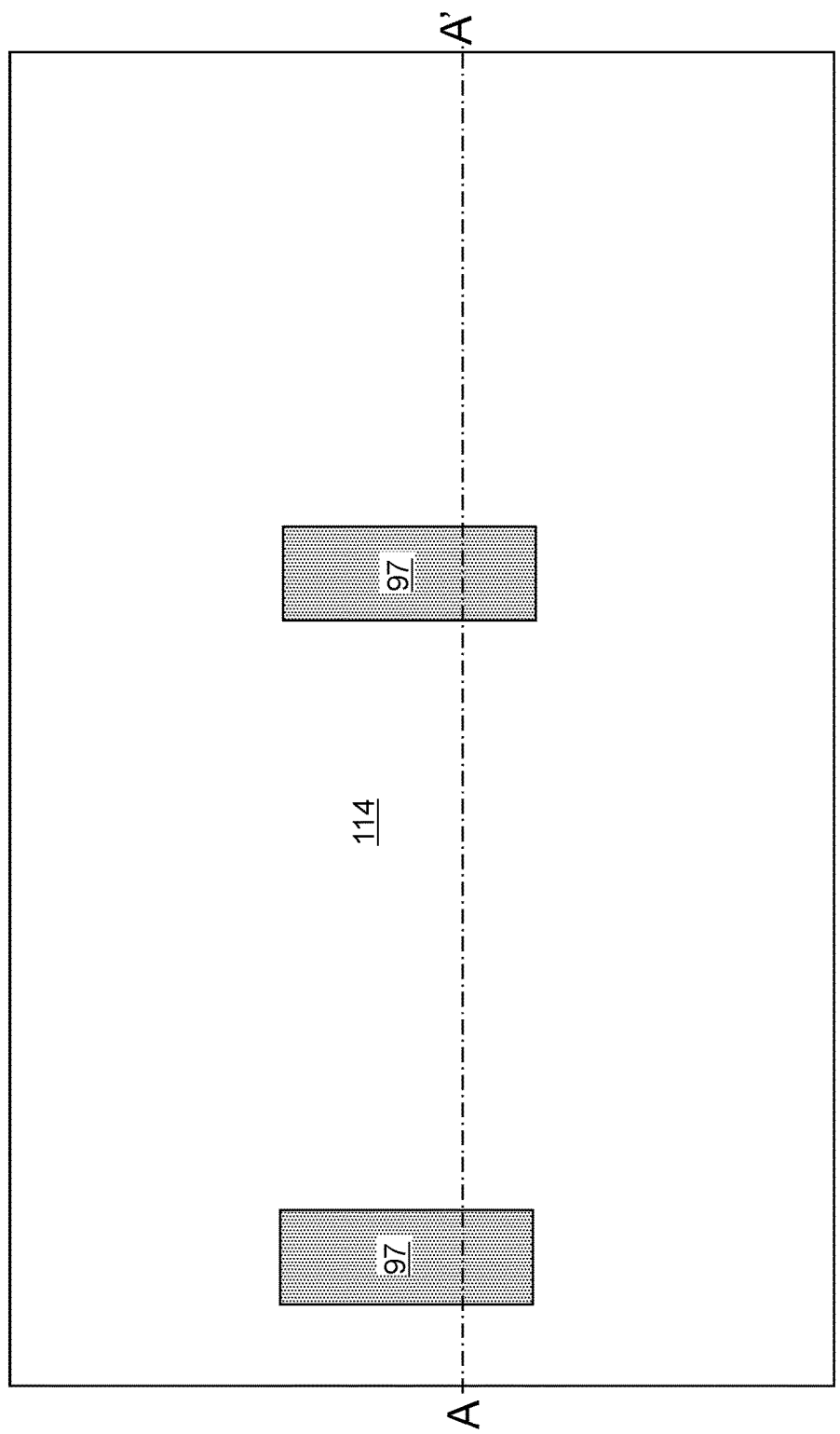
FIG. 4B is a top-down view of the first exemplary semiconductor structure of FIG. 4A.

Referring to FIGS. 4A and 4B, upper pad stacks (96, 97) of upper metal pad structures 96 and upper sacrificial pad structures 97 can be formed over the bonding level dielectric layer 114. A layer stack of at least one metallic material layer including a respective metallic material and a sacrificial material layer including a sacrificial material can be formed over the bonding level dielectric layer 114, and can be subsequently patterned to form the upper pad stacks (96, 97). For example, a metal layer, a metal nitride liner, and a sacrificial material layer can be sequentially deposited over the bonding level dielectric layer 114, and can be patterned by a combination of lithographic patterning steps and an etch process to form the upper pad stacks (96, 97). The lithographic patterning steps can form a patterned photoresist layer covering discrete areas of the sacrificial material layer, and the etch process can include an anisotropic etch process that sequentially etches physically exposed portions of the sacrificial material layer, the metallic liner layer, and the metal layer.

Each remaining portion of the sacrificial material layer constitutes an upper sacrificial pad structure 97. Each remaining portion of the metal nitride liner constitutes an upper metal nitride portion 964. Each remaining portion of the metal layer constitutes an upper metal portion 962. Each stack of an upper metal portion 962 and an upper metal nitride portion 964 constitutes an upper metal pad structure 96. An upper metal pad structure 96 and an upper sacrificial pad structure 97 can have vertically coincident sidewalls. Each upper metal pad structure 96 is electrically shorted to a respective node of the three-dimensional memory device 80 through a respective bonding level via structure 926.

The upper metal portions 962 can include, and/or consist essentially of, at least one elemental metal. For example, the upper metal portions 962 can include copper, tungsten, cobalt, aluminum, and/or elemental metals. The thickness of the upper metal portions 962 can be in a range from 30 nm to 600 nm, although lesser and greater thicknesses can also be employed. The upper metal nitride portions 964 can include, and/or consist essentially of, at least one conductive metal nitride such as titanium nitride, tantalum nitride, and/or tungsten nitride. The thickness of the upper metal nitride portions 964 can be in a range from 3 nm to 60 nm, although lesser and greater thicknesses can also be employed. The upper sacrificial pad portions 97 can include a material that can be removed selective to silicon oxide. For example, the upper sacrificial pad portions 97 can include silicon nitride, amorphous silicon, polysilicon, germanium, or a silicon germanium alloy. In one embodiment, the upper sacrificial pad structures 97 can include silicon nitride. The thickness of the upper sacrificial pad portions 97 can be in a range from 30 nm to 600 nm, although lesser and greater thicknesses can also be employed.

Horizontal cross-sectional shapes of the upper pad stacks (96, 97) may be polygonal, curved, or of any generally curvilinear closed two-dimensional shape. For example, the horizontal cross-sectional shapes of the upper pad stacks (96, 97) can be rectangular, triangular, pentagonal, hexagonal, heptagonal, octagonal, circular, elliptical, or can have a two-dimensional closed shape having at least one straight edge and/or at least one curved edge. The maximum lateral dimension for each upper pad stack (96, 97) can be in a range from 100 nm to 20,000 nm, such as from 500 nm to 10,000 nm, although lesser and greater maximum lateral dimensional can also be employed.

In one embodiment, the lower pad stacks (94, 95) and the upper pad stacks (96, 97) can have a same horizontal cross-sectional shape. For example, the lower pad stacks (94, 95) and the upper pad stacks (96, 97) can have a same rectangular horizontal cross-sectional shape.

Figure 5A:
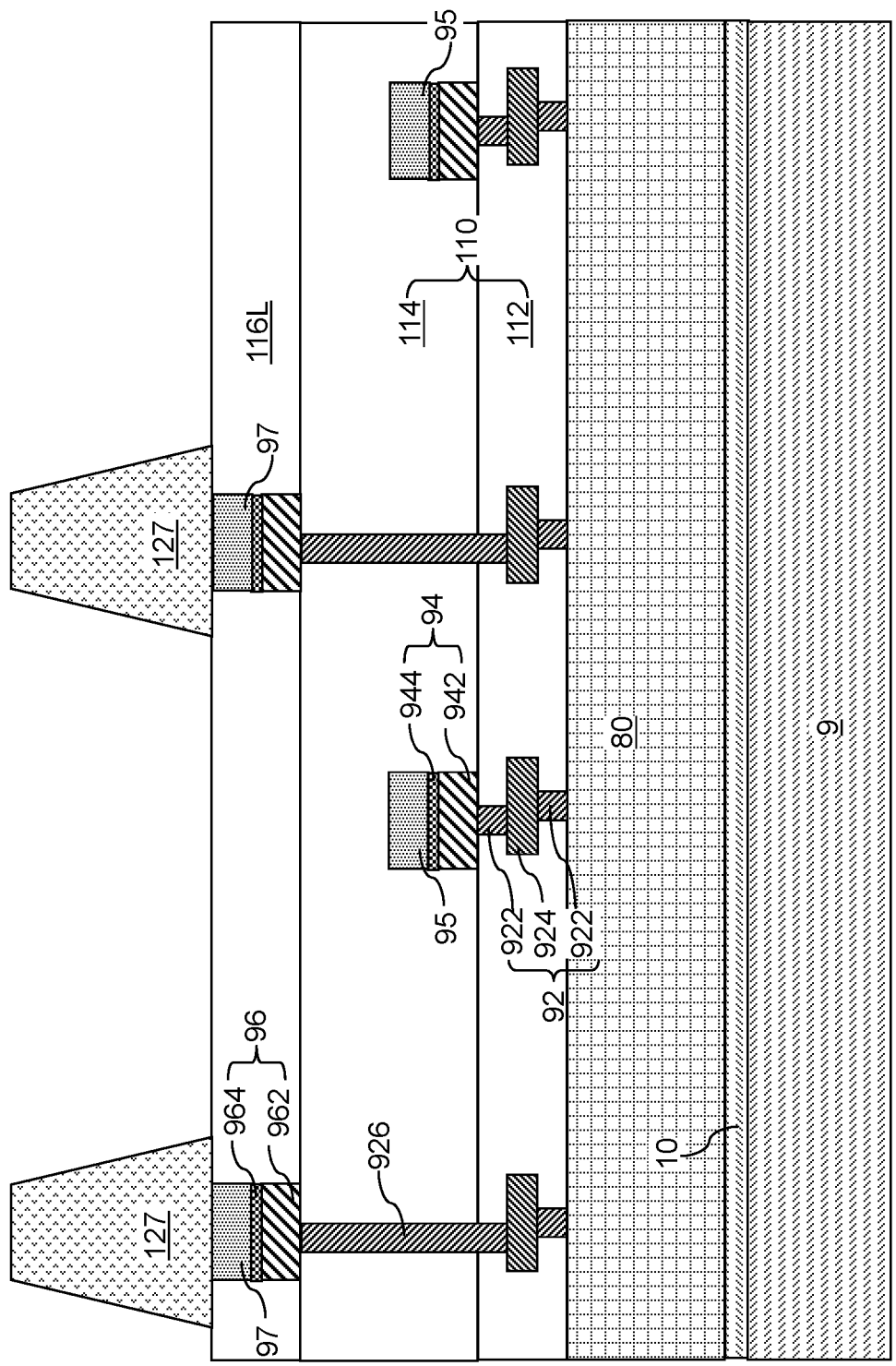
FIG. 5A is a vertical cross-sectional view of the first exemplary semiconductor structure after formation of a planarization insulating layer and a first patterned etch mask layer according to an embodiment of the present disclosure.
Figure 5B:
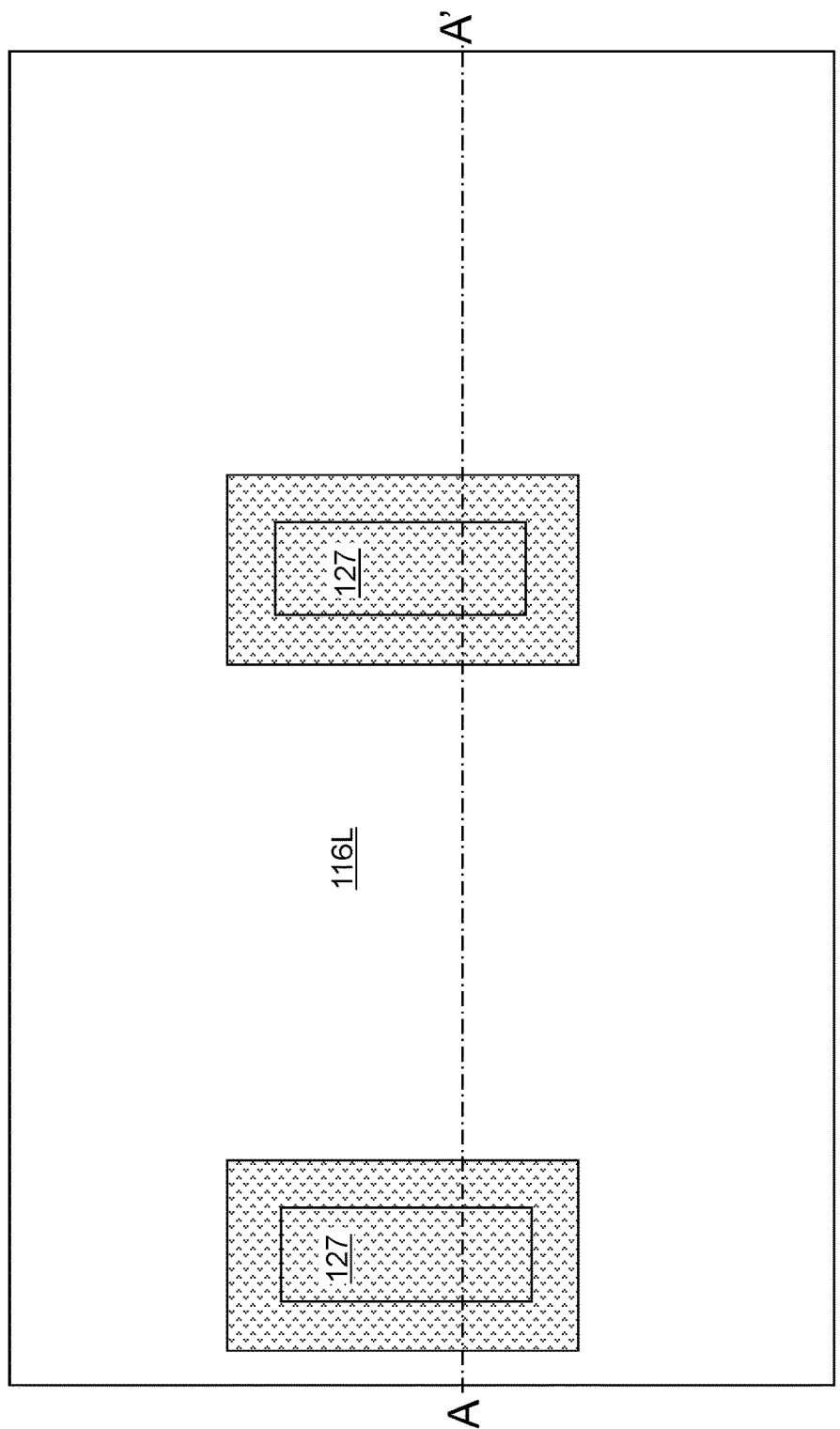
FIG. 5B is a top-down view of the first exemplary semiconductor structure of FIG. 4A.

Referring to FIGS. 5A and 5B, a planarization insulating layer 116L can be formed over the bonding level dielectric layer 114. The planarization insulating layer 116L can be formed by deposition of a dielectric material such as silicon oxide. The dielectric material can be deposited by a conformal deposition process such as a chemical vapor deposition (CVD) process or by a self-planarizing deposition process such as spin-coating. The planarization insulating layer 116L includes a horizontal planar top surface, which can be formed by a planarization process. For example, the planarization insulating layer 116L can be planarized to provide a top surface within a horizontal two-dimensional plane including top surfaces of the upper pad stacks (96, 97).

A first patterned etch mask layer 127 can be applied over the planarization insulating layer 116L and the upper pad stacks (96, 97). The first patterned etch mask layer 127 can be a photoresist layer that is lithographically patterned to cover each upper pad stack (96, 97). In one embodiment, the first patterned etch mask layer 127 can be patterned with tapered sidewalls having a taper angle (as measured from a vertical line) in a range from 5 degrees to 45 degrees, such as from 10 degrees to 30 degrees. For example, the first patterned etch mask layer 127 can include a grey photoresist material, and a lithographic exposure process that provides gradual transition of the intensity of illumination at edges of images can be employed to pattern the grey photoresist material with tapered sidewalls. Alternatively, the first patterned etch mask layer 127 can be patterned with substantially vertical sidewalls. In one embodiment, patterned portions of the first patterned etch mask layer 127 can have a same shape and a same size. For example, the first patterned etch mask layer 127 can have a shape of a circular frustum, an elliptical frustum, a rectangular frustum, a circular cylinder, an elliptical cylinder, cube or cuboid. Each upper pad stack (96, 97) can be covered by a bottom surface of a respective patterned portion of the first patterned etch mask layer 127.

Figure 6B:
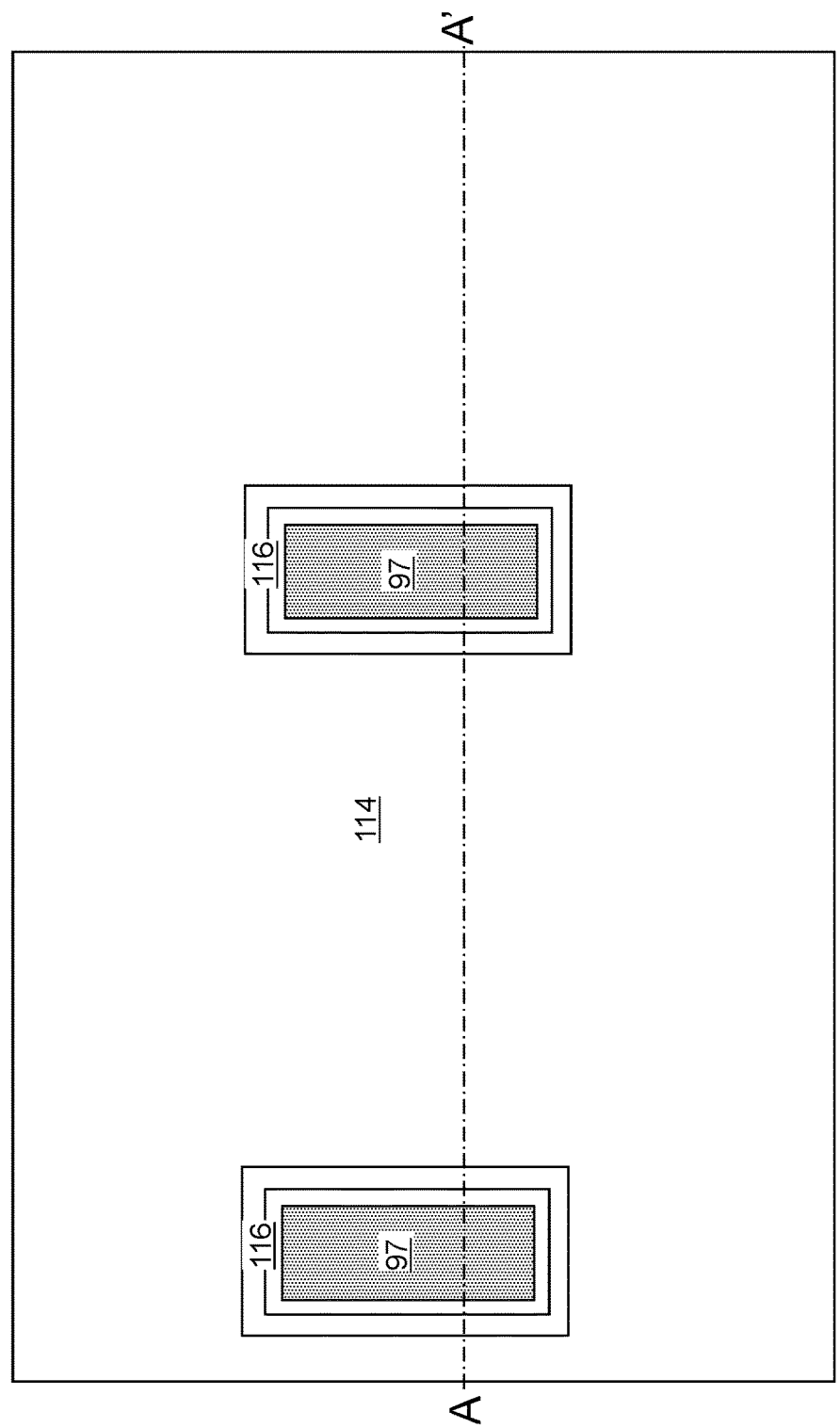
FIG. 6B is a top-down view of the first exemplary semiconductor structure of FIG. 6A.

Referring to FIGS. 6A and 6B, the planarization insulating layer 116L can be patterned into insulating ring structures 116 by an etch process that employs the first patterned etch mask layer 127 as an etch mask layer. For example, an anisotropic etch process can be performed to remove unmasked portions of the planarization insulating layer 116L. Each remaining masked portion of the planarizing insulating layer 116L constitutes an insulating ring structure 116 (e.g., sidewall spacers) that laterally surrounds a respective upper pad stack (96, 97). Each contiguous set of an upper pad stack (96, 97) and an insulating ring structure 116 constitutes an in-process mesa structure (96, 97, 116) that protrudes above the top surface of the bonding level dielectric layer 114. In one embodiment, each insulating ring structure 116 can include tapered sidewalls, which are herein referred to as tapered mesa sidewalls. The first patterned etch mask layer 127 can be removed, for example, by ashing.

Figure 7A:
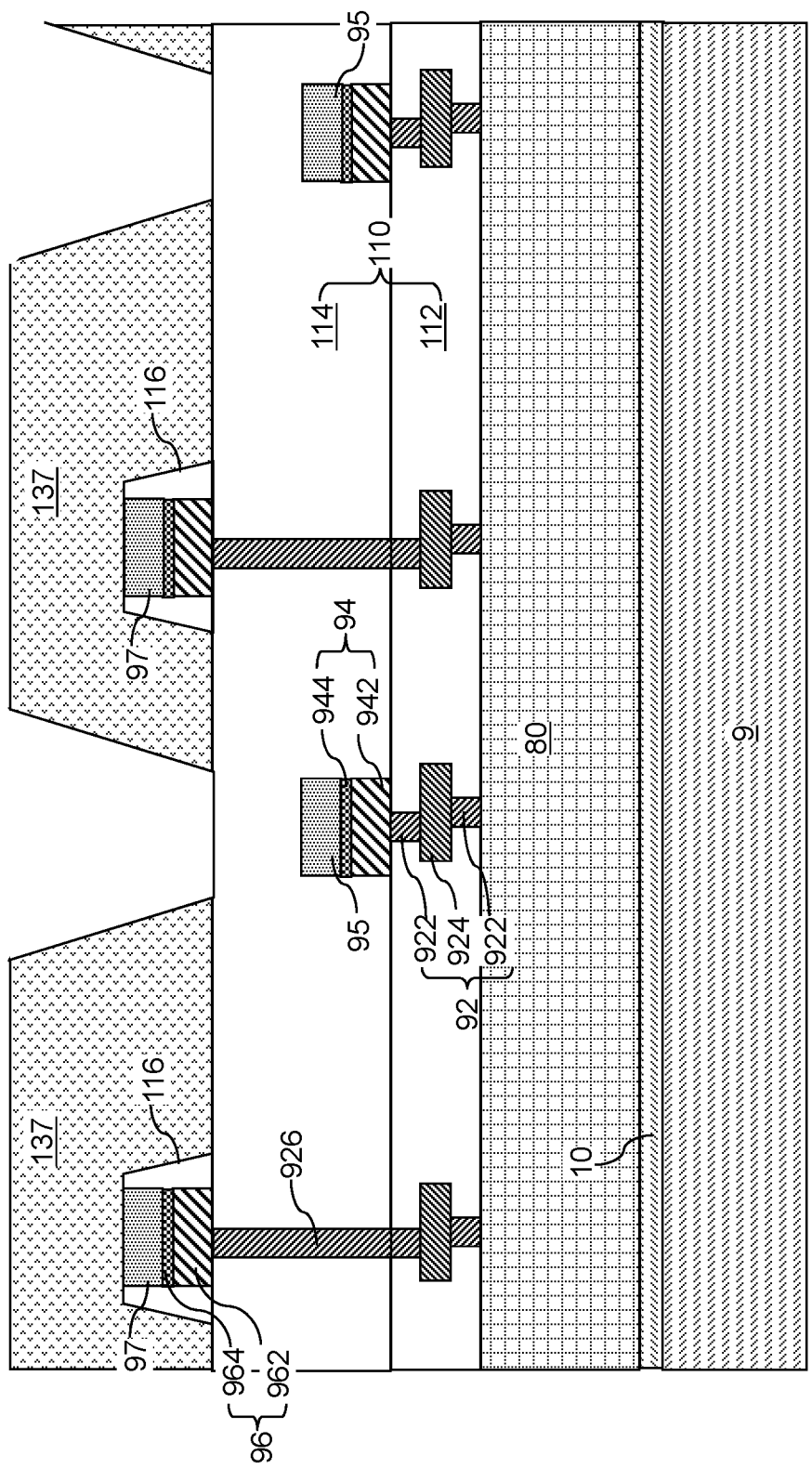
FIG. 7A is a vertical cross-sectional view of the first exemplary semiconductor structure after formation of a second patterned etch mask layer according to an embodiment of the present disclosure.
Figure 7B:
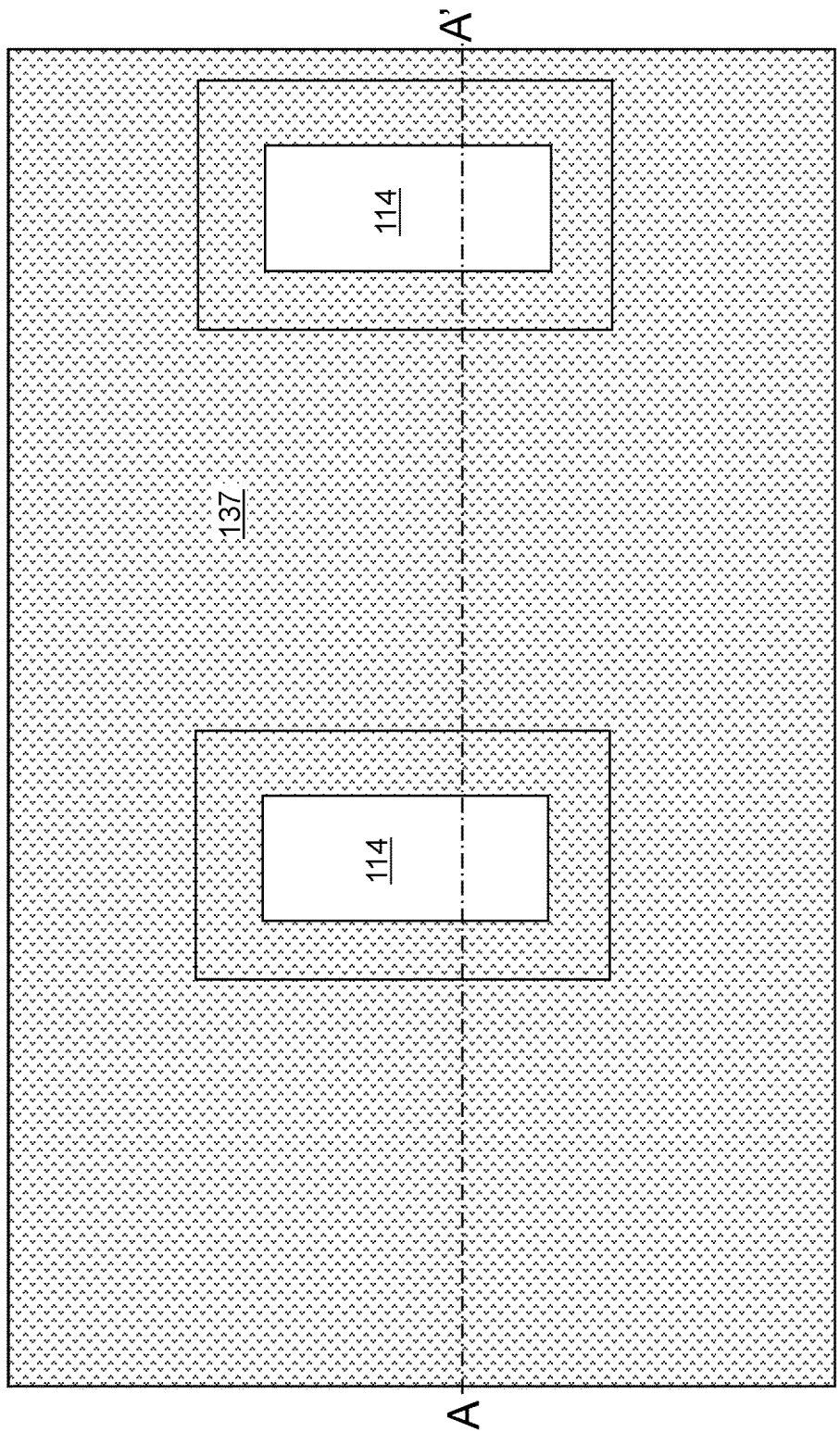
FIG. 7B is a top-down view of the first exemplary semiconductor structure of FIG. 7A.

Referring to FIGS. 7A and 7B, a second patterned etch mask layer 137 can be applied over the bonding level dielectric layer and the in-process mesa structures (96, 97, 116). The second patterned etch mask layer 137 can be a photoresist layer that is lithographically patterned to form openings over each lower pad stack (94, 95). In one embodiment, the second patterned etch mask layer 137 can be patterned with tapered sidewalls having a taper angle (as measured from a vertical line) in a range from 5 degrees to 45 degrees, such as from 10 degrees to 30 degrees. In this case, the taper angles of the sidewalls of the second patterned etch mask layer 137 can be the same as the taper angles of the sidewalls of the first patterned etch mask layer 127. For example, the second patterned etch mask layer 137 can include a grey photoresist material, and a lithographic exposure process that provides gradual transition of the intensity of illumination at edges of images can be employed to pattern the grey photoresist material with tapered sidewalls. Alternatively, the second patterned etch mask layer 137 can be patterned with substantially vertical sidewalls. In one embodiment, patterned portions of the second patterned etch mask layer 137 can have a same shape and a same size. For example, each volume of openings through the second patterned etch mask layer 137 can have a shape of an inverted circular frustum, an inverted elliptical frustum, an inverted rectangular frustum, a circular cylinder, an elliptical cylinder, cube or cuboid. Each lower pad stack (94, 95) can be located underneath the area of a respective opening of the second patterned etch mask layer 137.

Figure 8A:
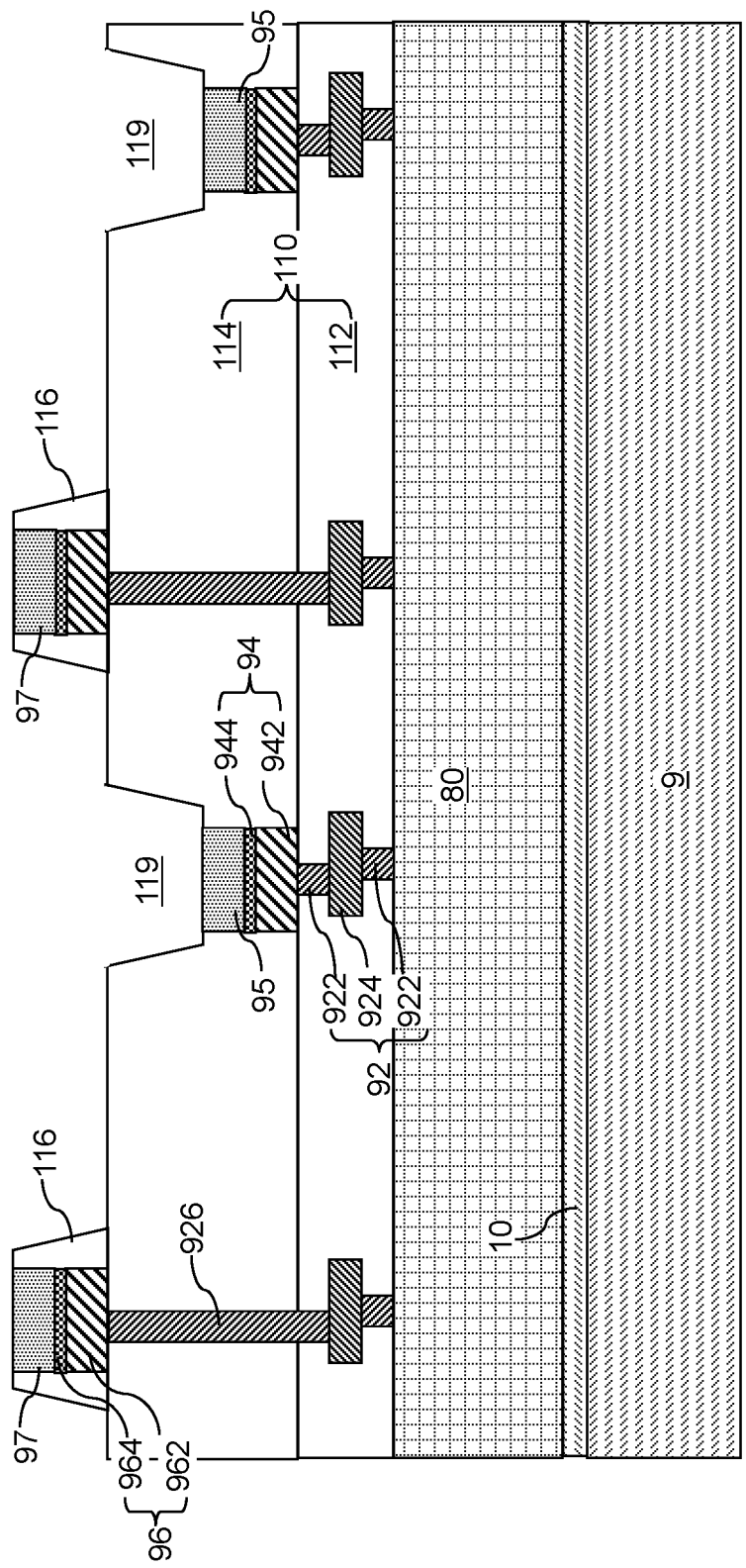
FIG. 8A is a vertical cross-sectional view of the first exemplary semiconductor structure after formation of recess cavities and exposure of the lower sacrificial pad structures according to an embodiment of the present disclosure.
Figure 8B:
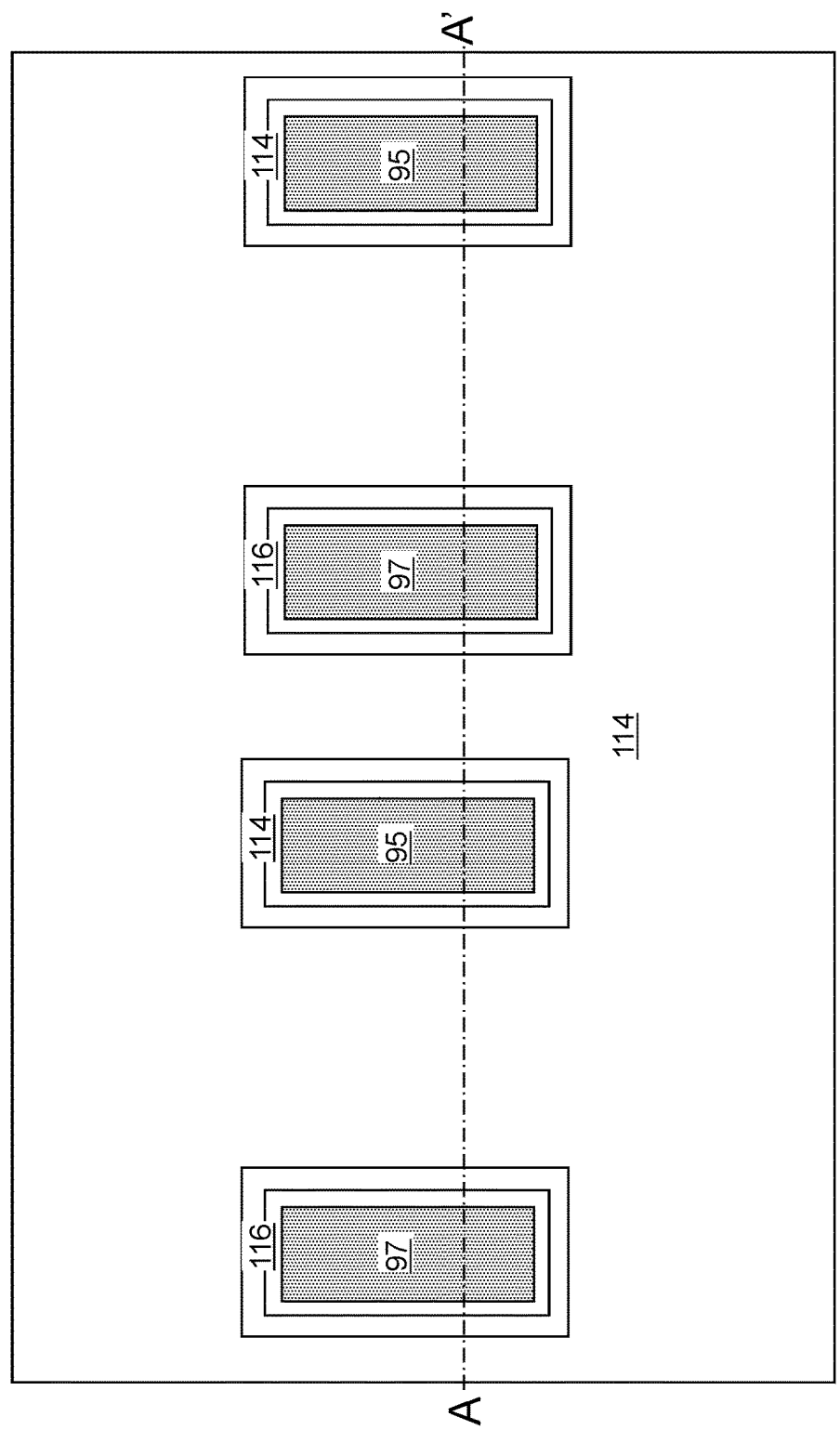
FIG. 8B is a top-down view of the first exemplary semiconductor structure of FIG. 8A.

Referring to FIGS. 8A and 8B, the bonding level dielectric layer 114 can be patterned to form recess cavities 119 by an etch process that employs the second patterned etch mask layer 137 as an etch mask layer. For example, an anisotropic etch process can be performed to remove upper portions of the bonding level dielectric layer 114 underneath each opening in the second patterned etch mask layer 137. The recessed cavities are formed underneath the openings in the second patterned etch mask layer 137, and vertically extends to top surface of the lower pad stacks (94, 95). The entire top surface of each lower sacrificial pad structure 95 is physically exposed at the bottom the recess cavities 119. In one embodiment, each recess cavity can include tapered sidewalls, which are herein referred to as tapered recess sidewalls. In one embodiment, the recess cavities 119 can have the same shape and the same volume among one another. Each recess cavity 119 can have tapered recess sidewalls having an inverted vertical cross-sectional profile of the tapered mesa sidewalls of the in-process mesa structures (96, 97, 116). In other words, the shape of each recess cavity 119 can be an inverted shape of the shape of each in-process mesa structure (96, 97, 116). The second patterned etch mask layer 137 can be removed, for example, by ashing.

Figure 9A:
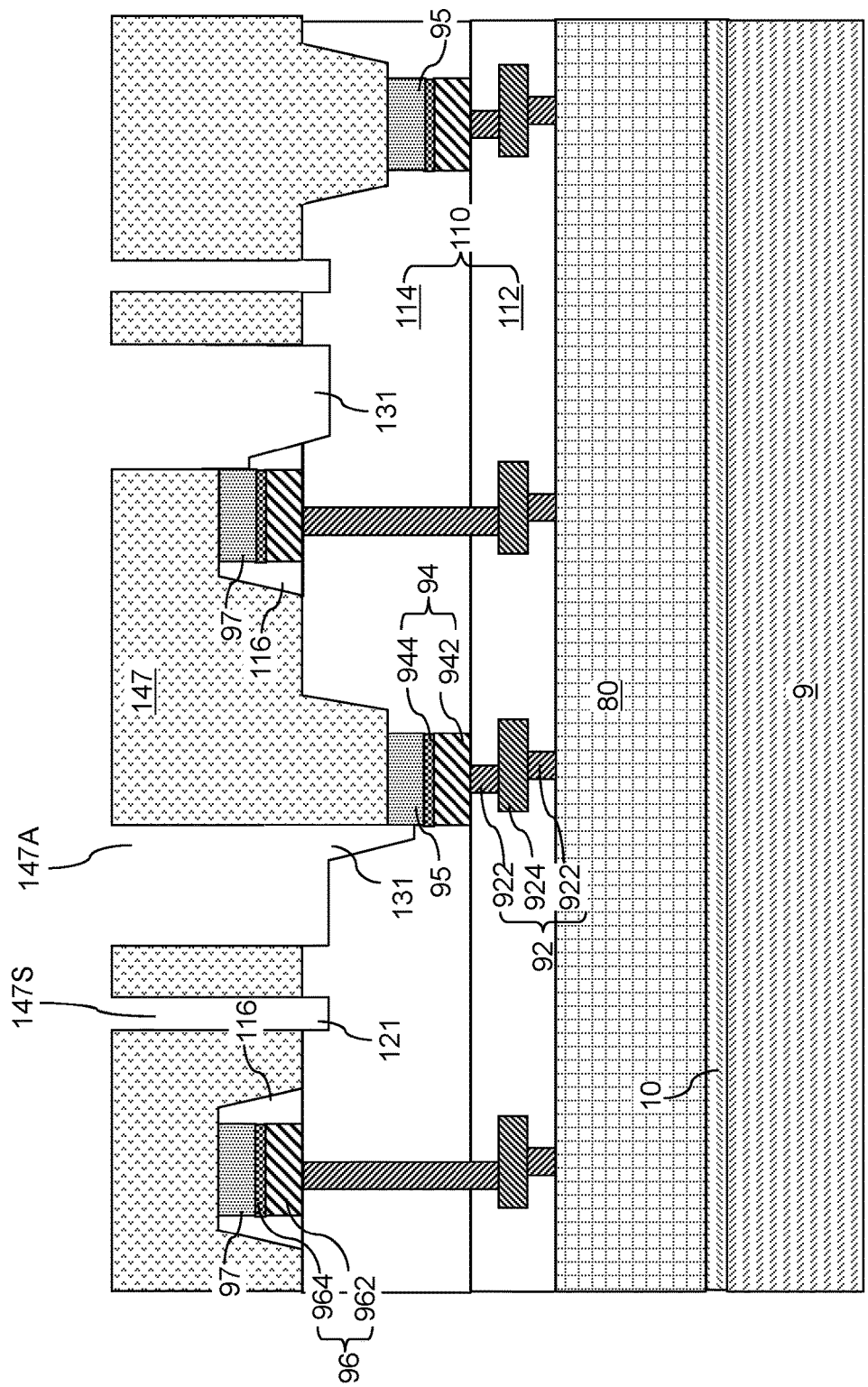
FIG. 9A is a vertical cross-sectional view of the first exemplary semiconductor structure after formation of recessed surface grooves extending to a periphery of the top surface of the first exemplary semiconductor structure according to an embodiment of the present disclosure.
Figure 9B:
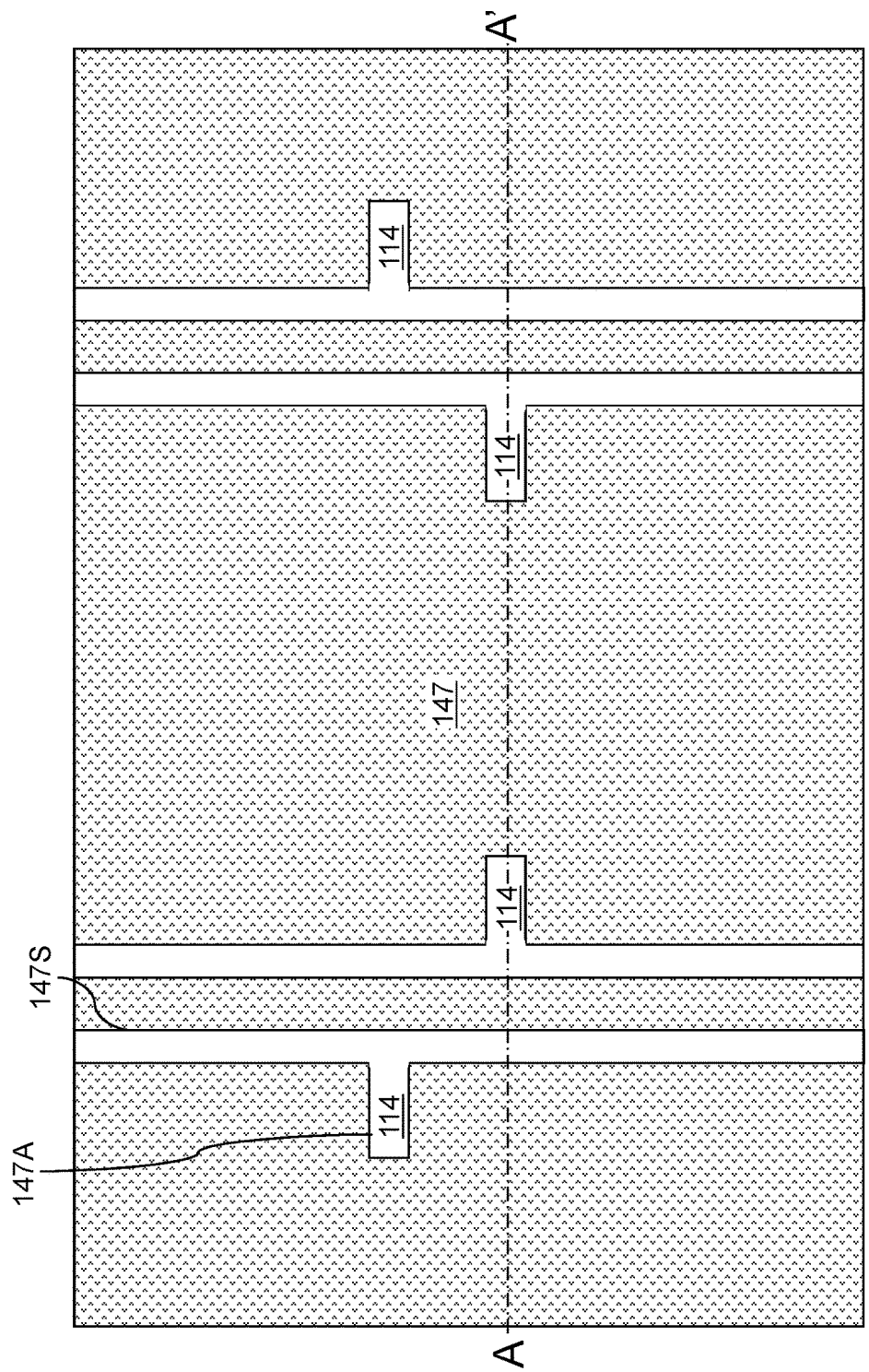
FIG. 9B is a top-down view of the first exemplary semiconductor structure of FIG. 9A.

Referring to FIGS. 9A and 9B, a photoresist layer 147 can be applied over the in-process mesa structures (96, 97, 116), the bonding level dielectric layer 114, and the recess cavities 119. The photoresist layer 147 can be lithographically patterned to form a set of line connections between a respective peripheral edge of the top surface of the bonding level dielectric layer 114 and each region overlying the in-process mesa structures (96, 97, 116) and the recess cavities 119. In one embodiment, each peripheral edge of the top surface of the bonding level dielectric layer 114 can be a peripheral edge of the first exemplary semiconductor structure. In one embodiments, the line connections can include street regions 147S extending over the bonding level dielectric layer 114 from a peripheral edge of the first exemplary semiconductor structure to a location proximal to one of the in-process mesa structures (96, 97, 116) and the recess cavities 119, and alley regions 147A that extend from a respective street region to location overlying an edge of an in-process mesa structures (96, 97, 116) or an edge of a recess cavity 119. In one embodiment, the street regions 147S and the alley regions 147A can have a same width that is less than the maximum lateral dimension of an in-process mesa structures (96, 97, 116) and less than the maximum lateral dimension of a recess cavity 119. For example, the ratio of the width of a line connection to the maximum lateral dimension of an in-process mesa structures (96, 97, 116) can be in a range from 0.001 to 0.2, such as from 0.01 to 0.1, although lesser and greater ratios can also be employed. Likewise, the ratio of the width of a line connection to the maximum lateral dimension of a recess cavity 119 can be in a range from 0.001 to 0.2, such as from 0.01 to 0.1, although lesser and greater ratios can also be employed.

An anisotropic etch process is performed to transfer the pattern of the line connections, as embodied as volumes between patterned portions of the photoresist layer 147, into upper portions of the bonding level dielectric layer 114 and the insulating ring structures 116. Continuous channel cavities in a shape of recessed surface grooves (121, 131) are formed in volumes from which the materials of the bonding level dielectric layer 114 and the insulating ring structures 116 are removed by the anisotropic etch process. Each continuous channel cavity contains one or more alley grooves 131 which extend between a mesa structure (96, 97, 116) and a respective street groove 121, which extends to a peripheral edge of the first exemplary semiconductor structure. The recessed surface grooves (121, 131) may have planar bottom surfaces and vertical sidewalls, or may have a rounded bottom surface that continuously extends to the top surface of the bonding level dielectric layer 114 and/or to the top surface of an insulating ring structure 116. The depth of the recessed surface grooves can be on the order of the width of the recessed surface grooves, and can be in a range from 50 nm to 1,000 nm, although lesser and greater depths can also be employed.

Figure 10A:
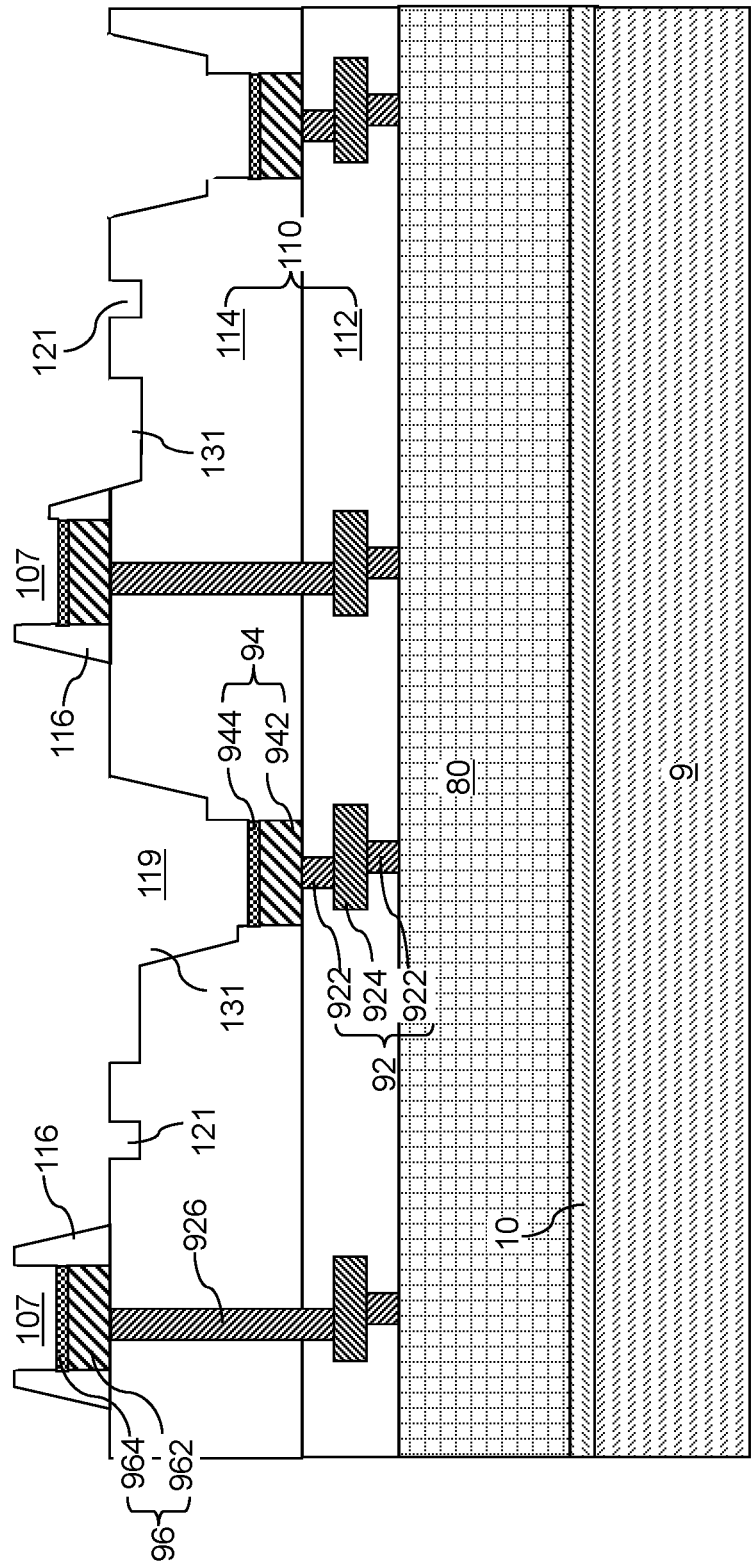
FIG. 10A is a vertical cross-sectional view of the first exemplary semiconductor structure after removal of the upper and lower sacrificial pad structures according to an embodiment of the present disclosure.
Figure 10B:
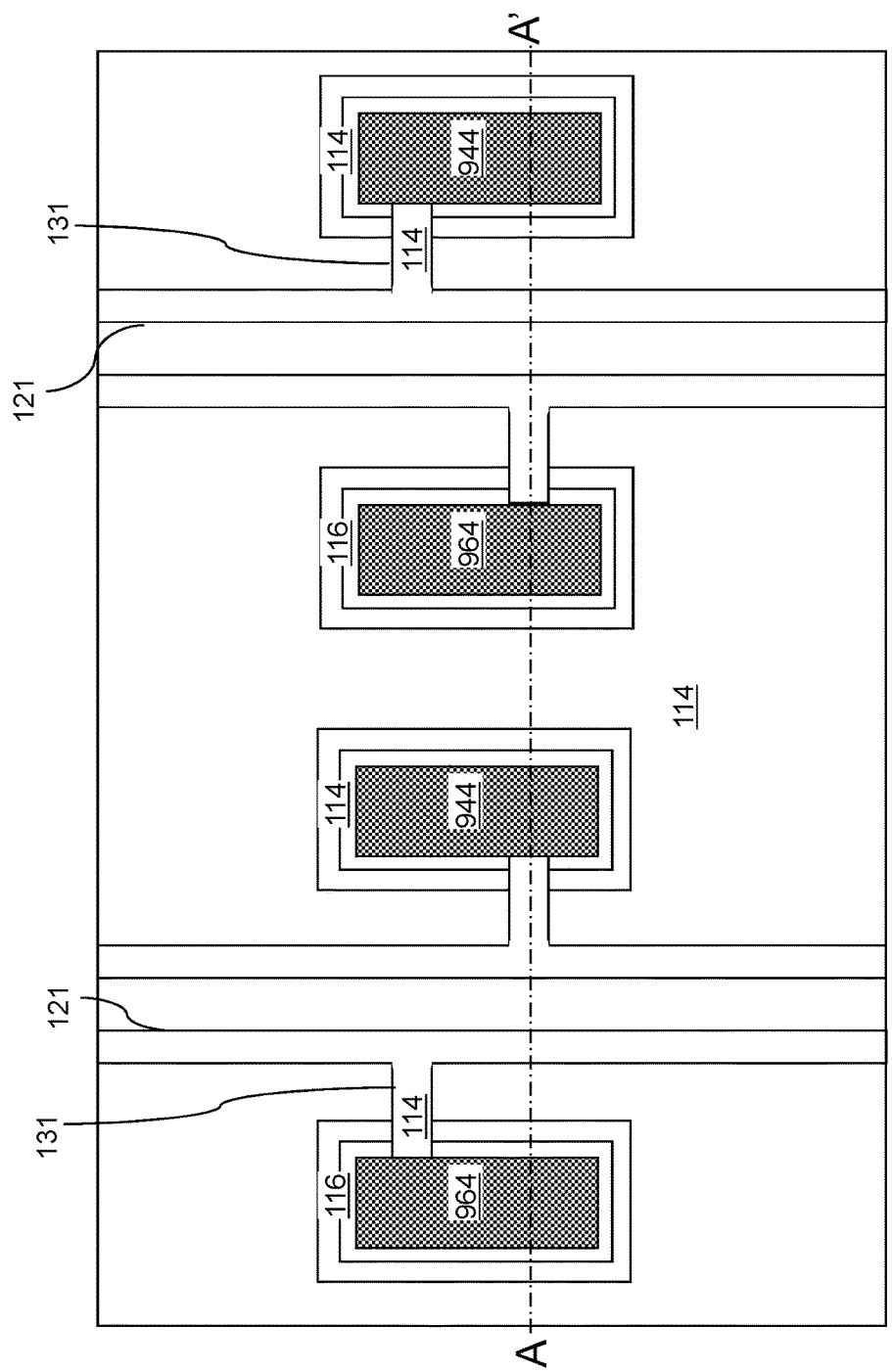
FIG. 10B is a top-down view of the first exemplary semiconductor structure of FIG. 10A.

Referring to FIGS. 10A and 10B, the photoresist layer 147 can be subsequently removed, for example, by ashing.

Subsequently, the upper sacrificial pad structures 97 and the lower sacrificial pad structures 95 can be removed selective to the upper metal pad structures 96, the lower metal pad structures 94, the bonding level dielectric layer 114, and the insulating ring structures 116 by a selective etch process. For example, if the bonding level dielectric layer 114 and the insulating ring structures 116 include silicon oxide, and if the upper sacrificial pad structures 97 and the lower sacrificial pad structures 95 include silicon nitride, a wet etch process employing hot phosphoric acid can be employed to remove the upper sacrificial pad structures 97 and the lower sacrificial pad structures 95 selective to the upper metal pad structures 96, the lower metal pad structures 94, the bonding level dielectric layer 114, and the insulating ring structures 116. If the lower sacrificial pad structures 95 include a semiconductor material such as amorphous silicon or polysilicon, a wet etch chemistry employing an alkaline etchant (such as $NH_4OH$ or trimethyl-2 hydroxyethyl ammonium hydroxide ("TMY")) may be employed to remove the lower sacrificial pad structures 95 while minimizing collateral damage to the upper metal pad structures 96, the lower metal pad structures 94. Top surfaces of the upper metal pad structures 96 and the lower metal pad structures 94 are physically exposed. Each contiguous combination of an upper metal pad structure 96 and an insulating ring structure 116 comprises a mesa structure. A recess region 107 is present above each upper metal pad structure 96. The continuous channel cavities in a shape of recessed surface grooves (121, 131) remain in the top surface of the bonding level dielectric layer 114.

Figure 11:
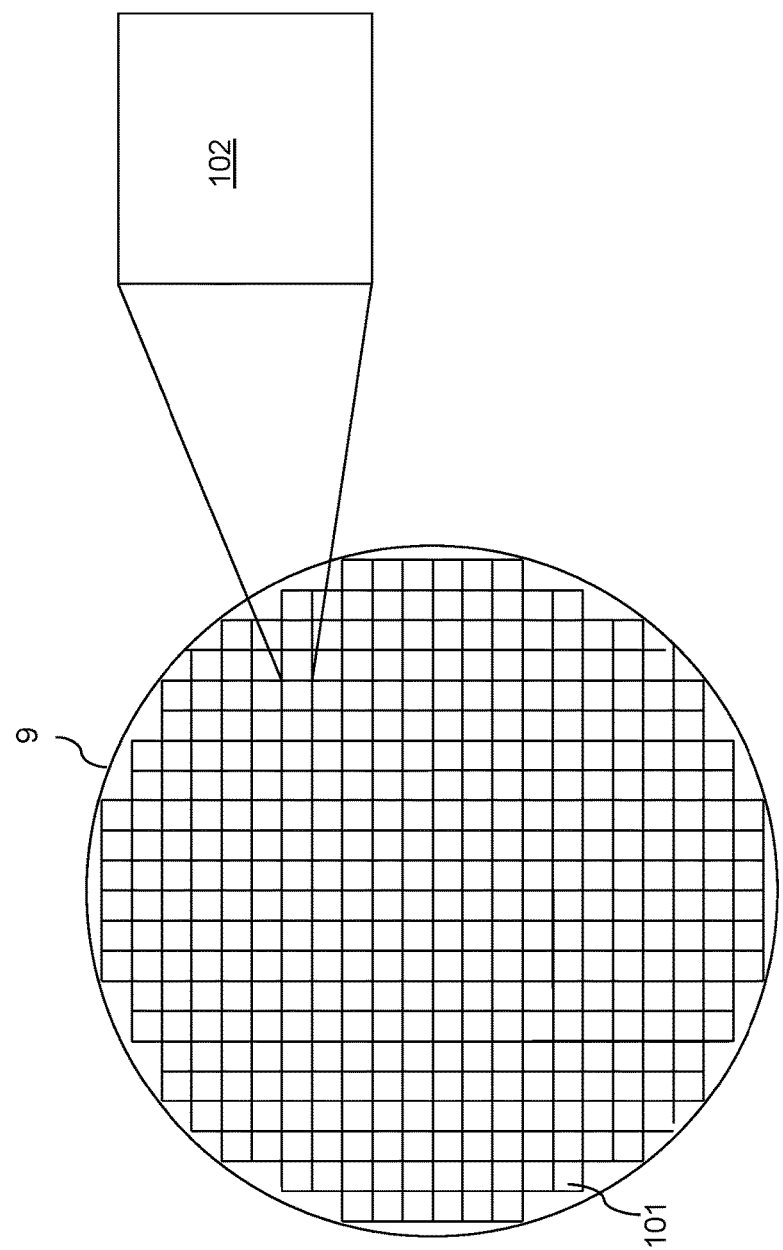
FIG. 11 is a semiconductor wafer including a plurality of semiconductor dies, each incorporating an instance of the first exemplary semiconductor structure, prior to dicing into discrete semiconductor chips.

Referring to FIG. 11, a substrate 9 which comprises a semiconductor wafer, such as a silicon wafer, including a plurality of semiconductor dies 101 is illustrated. Each semiconductor die 101 can incorporate an instance of the first exemplary semiconductor structure illustrated in FIGS. 10A and 10B. Thus, multiple instances of the first exemplary semiconductor structure can be embodied as the plurality of semiconductor dies 101 on the semiconductor wafer 9. The semiconductor wafer 9 can be diced into discrete semiconductor chips 102, which are multiple instances of the first exemplary semiconductor structure. The diced semiconductor chips 102 can include a first semiconductor chip that can be employed as a first exemplary substrate in subsequent processing steps, and a second semiconductor chip that can be employed as a second exemplary substrate in subsequent processing steps. Alternatively, a first exemplary substrate can be provided by dicing a first semiconductor wafer, and a second exemplary substrate can be provided by dicing a second semiconductor wafer. In one embodiment, the first exemplary substrate and the second exemplary substrate can include a same semiconductor chip. In another embodiment, the first exemplary substrate and the second exemplary substrate can include different semiconductor chips. For example, the first exemplary substrate can be a memory chip, and the second exemplary substrate can be a logic chip. A logic chip can include driver circuitry containing transistors in a CMOS configuration for a memory device, such as a NAND memory device. The driver circuitry can include sense amplifiers, data latches, word line decoders and other peripheral circuitry.

Figure 12:
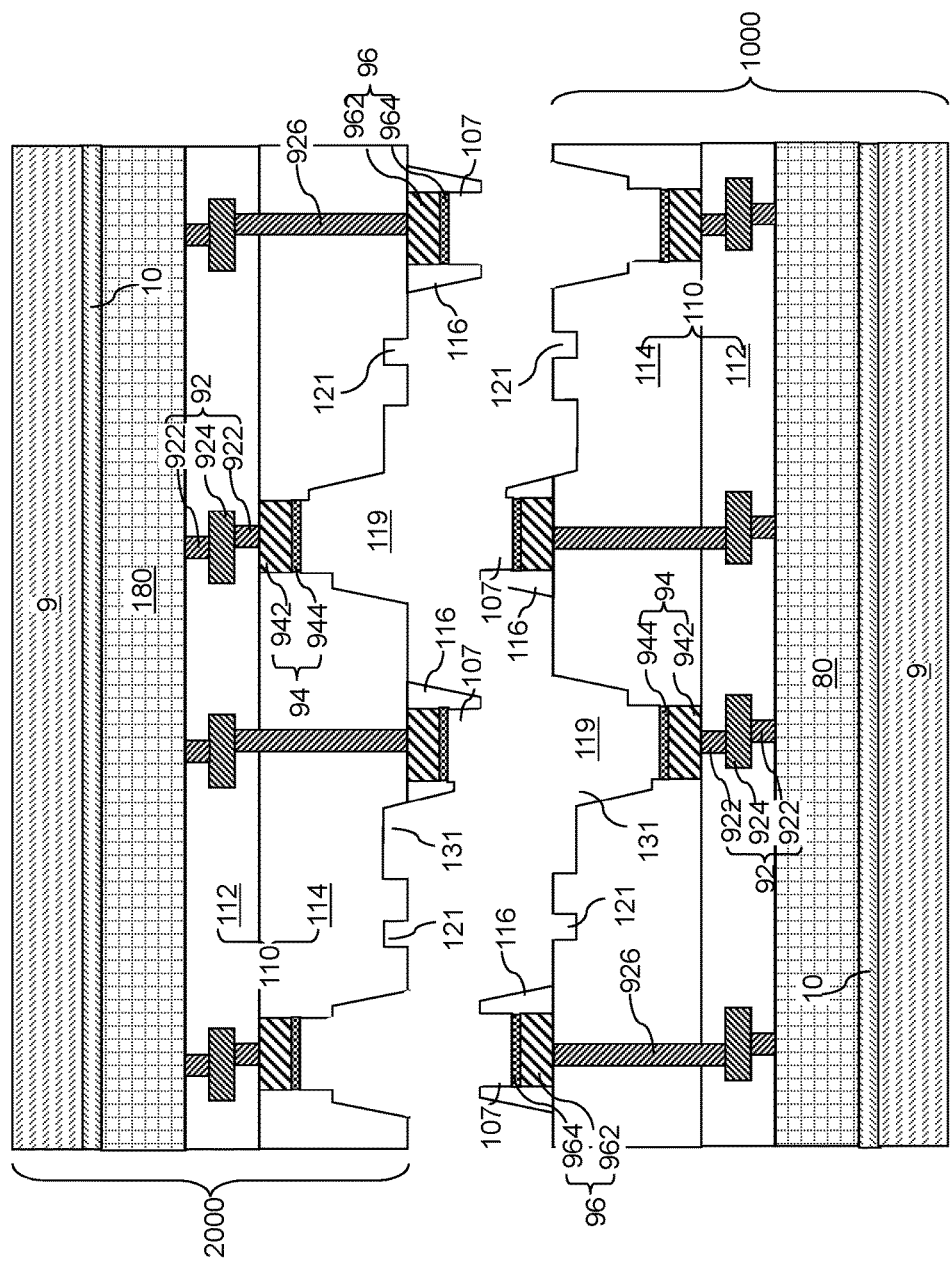
FIG. 12 is a vertical cross-sectional view of a first exemplary in-process structure for forming a bonded structure after generally aligning a first exemplary substrate and a second exemplary substrate such that a first bonding-side planar surface of the first exemplary substrate faces a second bonding-side planar surface of the second exemplary substrate according to an embodiment of the present disclosure.

Referring to FIG. 12, a first exemplary in-process structure for forming a bonded structure is illustrated, which includes a first exemplary substrate 1000 and a second exemplary substrate 2000. The first exemplary substrate 1000 contains first semiconductor devices 80, which can be the three-dimensional array of NAND memory devices described above with respect to FIGS. 1A and 1B. The second exemplary substrate 2000 contains second semiconductor devices 180, which can be additional memory devices or driver circuitry for the first memory devices 80 described above with respect to FIGS. 1A and 1B. The pattern of the mesa structures (94, 116) and the recess cavities 119 on the top surface of the second exemplary substrate 2000 can be selected to be an inverse pattern of the mesa structures (94, 116) and the recess cavities 119 on the top surface of the first exemplary substrate 1000. In other words, mesa structures on substrate 1000 face recess cavities on substrate 2000; likewise recess cavities on substrate 1000 face mesa structures on substrate 2000. The physically exposed surfaces of the bonding level dielectric layer 114 on the first exemplary substrate 1000 is herein referred to as a first bonding-side planar surface. The physically exposed surfaces of the bonding level dielectric layer 114 on the second exemplary substrate 2000 is herein referred to as a second bonding-side planar surface.

The first exemplary substrate 1000 and the second exemplary substrate 2000 are generally aligned such that the first bonding-side planar surface of the first exemplary substrate 1000 faces the second bonding-side planar surface of the second exemplary substrate 2000. Generally, the first exemplary substrate 1000 includes the first bonding-side planar surface and first mesa structures (96, 116) that protrude from the first bonding-side planar surface. Each first mesa structure (96, 116) comprises a first metal pad structure 96 containing a first metallic material (such as the metallic material of an upper metal nitride portion 964) and including a first metallic surface (such as the metallic surface of the upper metal nitride portion 964). The second exemplary substrate 2000 has the second bonding-side planar surface and first recess cavities 119 that are recessed from the second bonding-side planar surface. A second metal pad structure 94 comprising a second metallic material (such as the metallic material of a lower metal nitride portion 944) and including a second metallic surface (such as the metallic surface of the lower metal nitride portion 944) is located at a recessed region of each first recess cavity 119.

In one embodiment, second recess cavities 119 can be provided on the first exemplary substrate 1000. The second recess cavities 119 are recessed from the first bonding-side planar surface of the first exemplary substrate 1000. A third metal pad structure 94 including a respective third metallic surface (such as a surface of a lower metal nitride portion 944) is located at a recessed region of each second recess cavity 110 on the first exemplary substrate 1000. Second mesa structures (96, 116) can protrude from the second bonding-side planar surface on the second exemplary substrate 2000. Each second mesa structure includes a fourth metal pad structure 96 having a fourth metallic surface (such as a surface of an upper metal nitride portion 964). In one embodiment, each of the first and the second exemplary substrates (1000, 2000) contains both the mesa structures and the recess cavities. In another embodiment, the first exemplary substrate 1000 contains only the mesa structures, while the second exemplary substrate 2000 contains only the recess cavities. In yet another embodiment, the first exemplary substrate 1000 contains only the recess cavities, while the second exemplary substrate 2000 contains only the mesa structures.

Generally, the first exemplary substrate 1000 comprises an optional first semiconductor material layer 10 on which first semiconductor devices 80 are located and further comprises first interconnect level dielectric layers 112 embedding first metal interconnect structures 92 providing an electrically conductive path between each of the first metal pad structures 96 or the third metal pad structures 94 and a respective one of the first semiconductor devices 80. The second exemplary substrate 2000 comprises an optional second semiconductor material layer 10 on which second semiconductor devices 180 are located and further comprises second interconnect level dielectric layers 112 embedding second metal interconnect structures 92 providing an electrically conductive path between each of the second metal pad structures 94 or the fourth metal pad structures 96 and a respective one of the second semiconductor devices 180.

Figure 13:
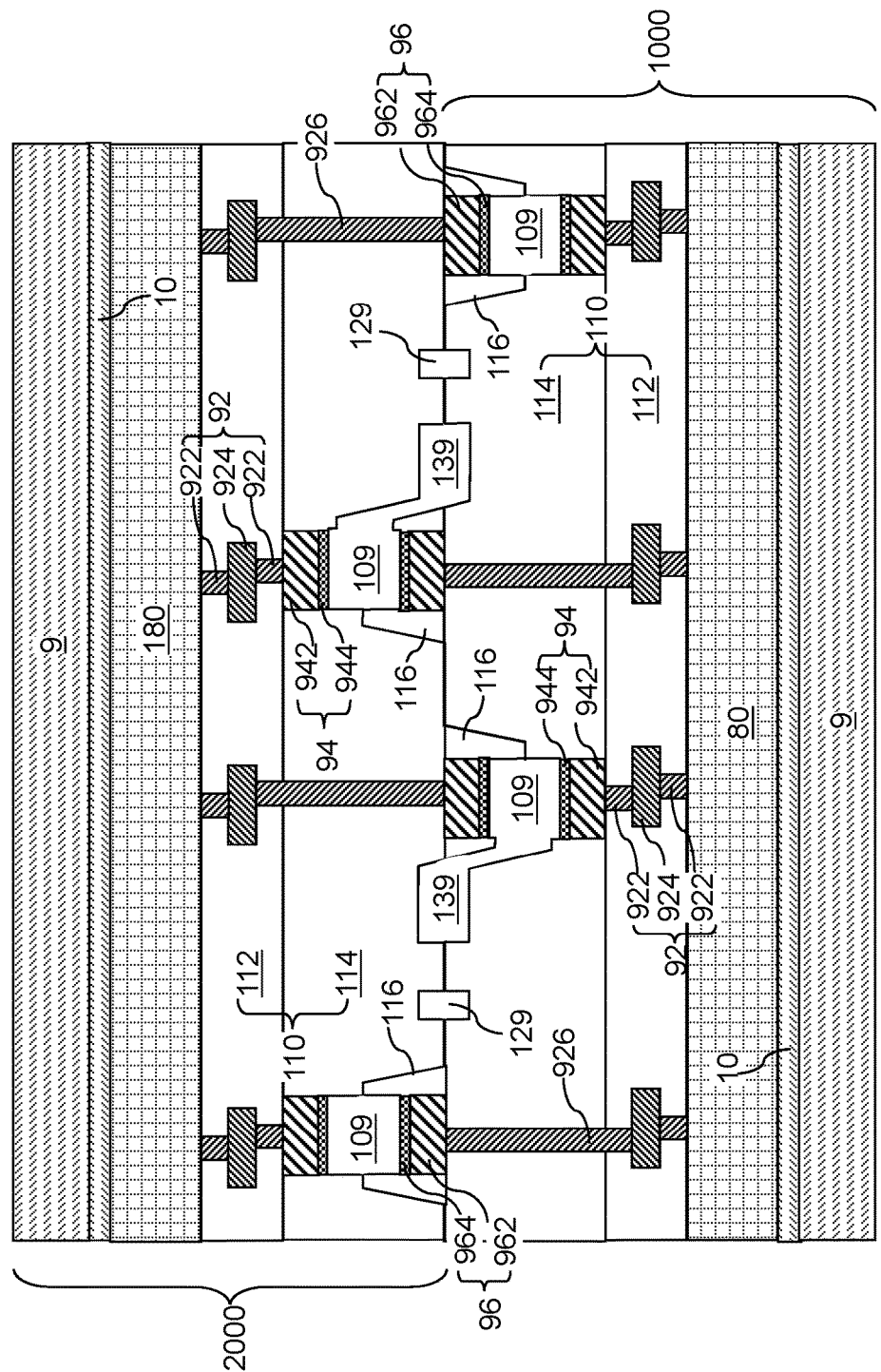
FIG. 13 is a vertical cross-sectional view of the first exemplary in-process structure for forming a bonded structure after brining into contact the first exemplary substrate and the second exemplary substrate according to an embodiment of the present disclosure.

Referring to FIG. 13, the first exemplary substrate 1000 and the second exemplary substrate 2000 are brought into contact with each other. Opposing pair of a mesa structure (96, 116) and a recess cavity 119 have complementary interlocking patterns with gaps (109, 129, 139) formed by the recess cavities 119 and the recessed surface grooves (121, 131). The mesa structures (96, 116) on the first and second exemplary substrates (1000, 2000) slide into matching recess cavities 119 as the distance between the first and second exemplary substrates (1000, 2000) decreases, and as the first bonding-side planar surface contacts the second bonding-side planar surface. Thus, each first mesa structure (96, 116) on the first exemplary substrate 1000 slides into an alignment position by self-alignment induced by sliding of the first tapered mesa sidewalls of an insulating ring structure 116 therein over the first tapered recess sidewalls of a respective first recess cavity 119. Likewise, each second mesa structure (96, 116) on the second exemplary substrate 2000 slides into an alignment position by self-alignment induced by sliding of the second tapered mesa sidewalls of an insulating ring structure 116 therein over the second tapered recess sidewalls of a respective second recess cavity 119.

Each first mesa structure (96, 116) of the first exemplary substrate 1000 can be disposed within a volume of a respective first recess cavity 119 of the second exemplary substrate 2000. Each second mesa structure (96, 116) of the second exemplary substrate 2000 can be disposed within a volume of a respective second recess cavity 119 of the first exemplary substrate 1000. A gap 109 is provided between each opposing pair of a first metal pad structure 96 on the first exemplary substrate 1000 and a second metal pad structure 94 of the second exemplary substrate 2000 within a volume of a respective first recess cavity 119. A gap 109 is provided between each opposing pair of a third metal pad structure 94 on the first exemplary substrate 1000 and a fourth metal pad structure 96 of the second exemplary substrate 2000 within a volume of a respective second recess cavity 119.

In one embodiment, continuous channel cavities 129 can be provided along the interface between the first bonding-side planar surface and the second bonding-side planar surface. Each continuous channel cavity 129 can be defined by a recessed surface groove located within the first exemplary substrate 1000 and/or by a recessed surface groove located within the second exemplary substrate 2000. In one embodiment, a continuous channel cavity 129 can be defined by a pair of a recessed surface groove located within the first exemplary substrate 1000 and a recessed surface groove located within the second exemplary substrate 2000. In this case, the recessed surface groove located within the first exemplary substrate 1000 can have a mirror pattern of the pattern of the recessed surface groove located within the second exemplary substrate 2000. Each continuous channel cavity 129 within a first subset of the continuous channel cavities 129 can continuously extend from an interlocked pair of a first mesa structure (96, 116) and a first gap to a peripheral edge of the one of the first and second exemplary substrates (1000, 2000). Each continuous channel cavity 129 within a second subset of the continuous channel cavities 129 can continuously extends from an interlocked pair of a second mesa structure (96, 116) and a second gap 109 to a peripheral edge of the one of the first and second exemplary substrates (1000, 2000).

Each vacant volume of the recess cavities 119 is located between an opposing pair of metal pad structures (94, 96), which includes an upper metal pad structure 96 and a lower metal pad structure 94. The vacant volumes of the recess cavities 119 are herein referred to as inter-pad cavities 109, which is connected to a respective one of the continuous channel cavities (129, 139). The continuous channel cavities (129, 139) include street channel cavities 129 formed by mating of opposing street groves 121 in opposing substrates (1000, 2000) and alley grooves 139 formed by mating of opposing alley grooves 131 in opposing substrates (1000, 2000).

Figure 14:
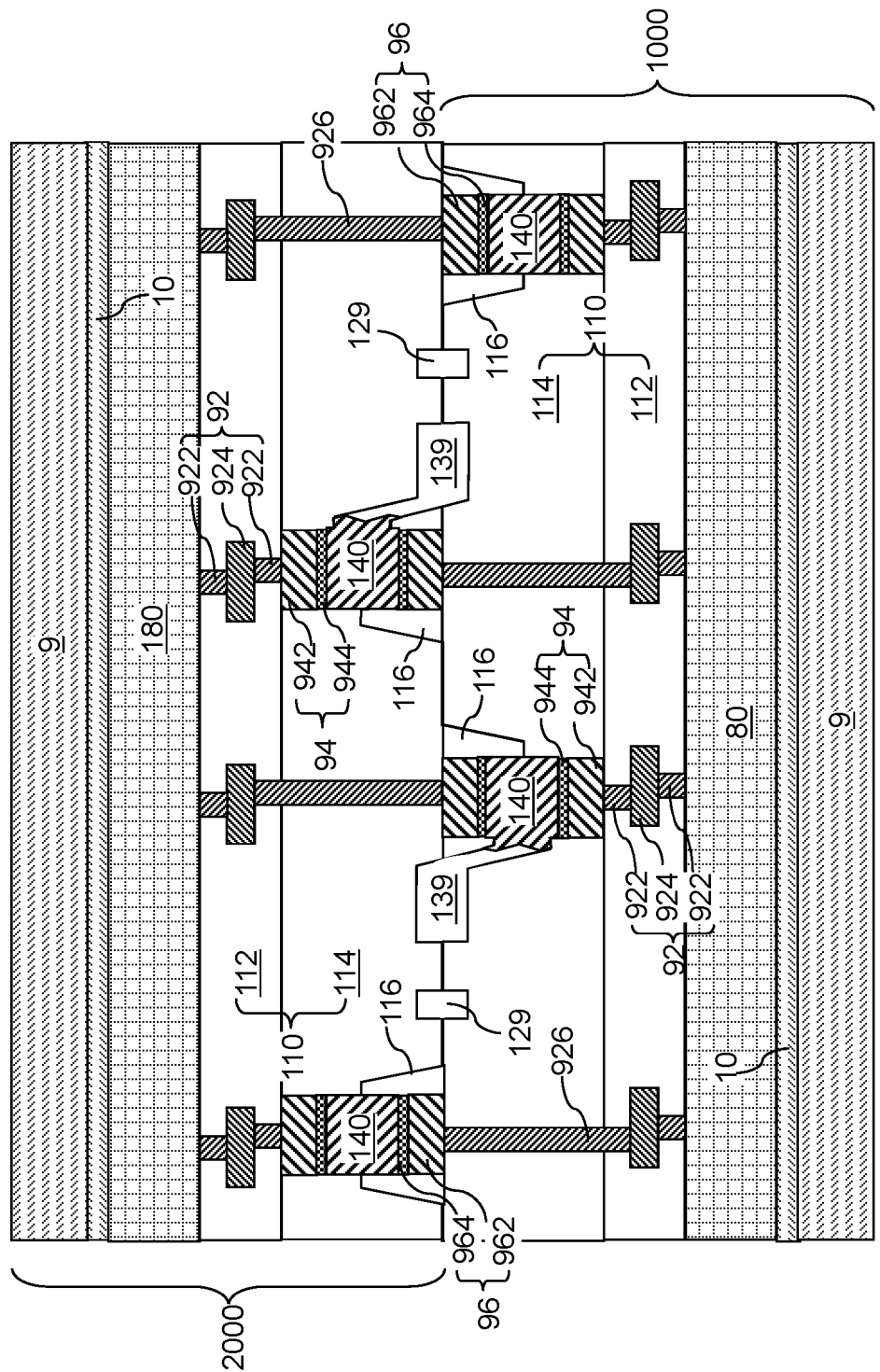
FIG. 14 is a vertical cross-sectional view of a first exemplary bonded structure after formation of metal connection pads according to an embodiment of the present disclosure.

Referring to FIG. 14, a selective metal deposition process can be performed to grow a metallic material from the physically exposed metallic surfaces of the metal pad structures (94, 96). In one embodiment, the selective growth of the metallic material can be performed by a chemical vapor deposition process in which the continuous channel cavities (129, 139) are employed as a conduit for a reactant gas that decomposed into the metallic material. Specifically, the reactant gases are provided from the edge of the bonded structure into the street cavities 129 which extend to the edge of the bonded structure. The reactant gases flow through the street channel cavities 129 into the alley channel cavities 139 and from the alley channel cavities 139 into the inter-pad cavities 109. The deposited metallic material can be, for example, tungsten, cobalt, or ruthenium. During the selective deposition process, the metallic material grows from the metallic surfaces of the metal pad structures (94, 96), but does not grow from the dielectric surfaces of the bonding level dielectric layers 114 and the insulating ring structures 116. The metallic material and the deposition chemistry are selected such that growth of the metallic material does not proceed from non-metallic surfaces. Selective chemical vapor deposition processes for growing a metallic material only from metallic surfaces while suppressing growth of the metallic material from dielectric surfaces are known in the art.

In one embodiment, the upper metal nitride portions 964 of the first metal pad structures 96 of the first and/or second exemplary substrate(s) (1000, 2000) contain the first metallic material, the lower metal nitride portions 944 of the second metal pad structures 94 of the first and/or second exemplary substrate(s) (1000, 2000) contain the second metallic material, and the deposited metallic material, which is herein referred to as a third metallic material, can be the same as, or different from, the first and/or the second metallic material(s). In one embodiment, the first and/or second metallic material(s) can include tungsten, cobalt, ruthenium, titanium nitride, tantalum nitride, or tungsten nitride, and the third metallic material can include tungsten, cobalt, or ruthenium. For example, first and second metallic materials can include titanium nitride, and the third metallic material can include tungsten deposited by decomposition of $WF_6$.

The third metallic material can be grown from the each of the metal pad structures (94, 96), and fills the entire volume of each inter-pad cavity 109 to form metal connection pads 140. A portion of the third metallic material grows from an upper metal pad structure 96 and another portion of the third metallic material grows from a lower metal pad structure 94 around each inter-pad cavity 109 until the two portions of the third metallic material merge to form a metal connection pad 140 that is a continuous structure. Each metal connection pad 140 may have a cylindrical or cuboid shape, and may include a spout portion that laterally protrudes into the adjacent alley channel cavity 139 at a slanted angle (i.e., along a non-horizontal and non-vertical direction) with respect to the interface between the first and second bonding-side planar surfaces. A plurality of metal connection pads 140 can be simultaneously formed by growth of the third metallic material each opposing pair of an upper metal pad structure 96 and a lower metal pad structure 94 within each unfilled volume of the recess cavities 119, i.e., within each volume of the inter-pad cavities 109.

In one embodiment, in case shapes of the physically exposed surfaces of an upper metal pad structure 96 and a lower metal pad structure 94 are not perfectly matched around an inter-pad cavity 109 and/or in case the physically exposed surfaces of an upper metal pad structure 96 and a lower metal pad structure 94 are laterally offset with respect to each other around an inter-pad cavity 109, the metal connection pad 140 formed in the inter-pad cavity 109 can have a horizontal step that corresponds to the mismatch or lateral shift between the physically exposed surfaces of the upper metal pad structure 96 and the lower metal pad structure 94. Optionally, a dielectric passivation material can be deposited in the street channel cavities 129 into the alley channel cavities 139 by a conformal deposition process such as low pressure chemical vapor deposition. The dielectric passivation material can include, for example, silicon nitride and/or silicon oxide. Dielectric passivation material portions deposited in the street channel cavities 129 into the alley channel cavities 139 can block ingress of moisture or other contaminants into the interface region of the bonded structure.

Figure 15:
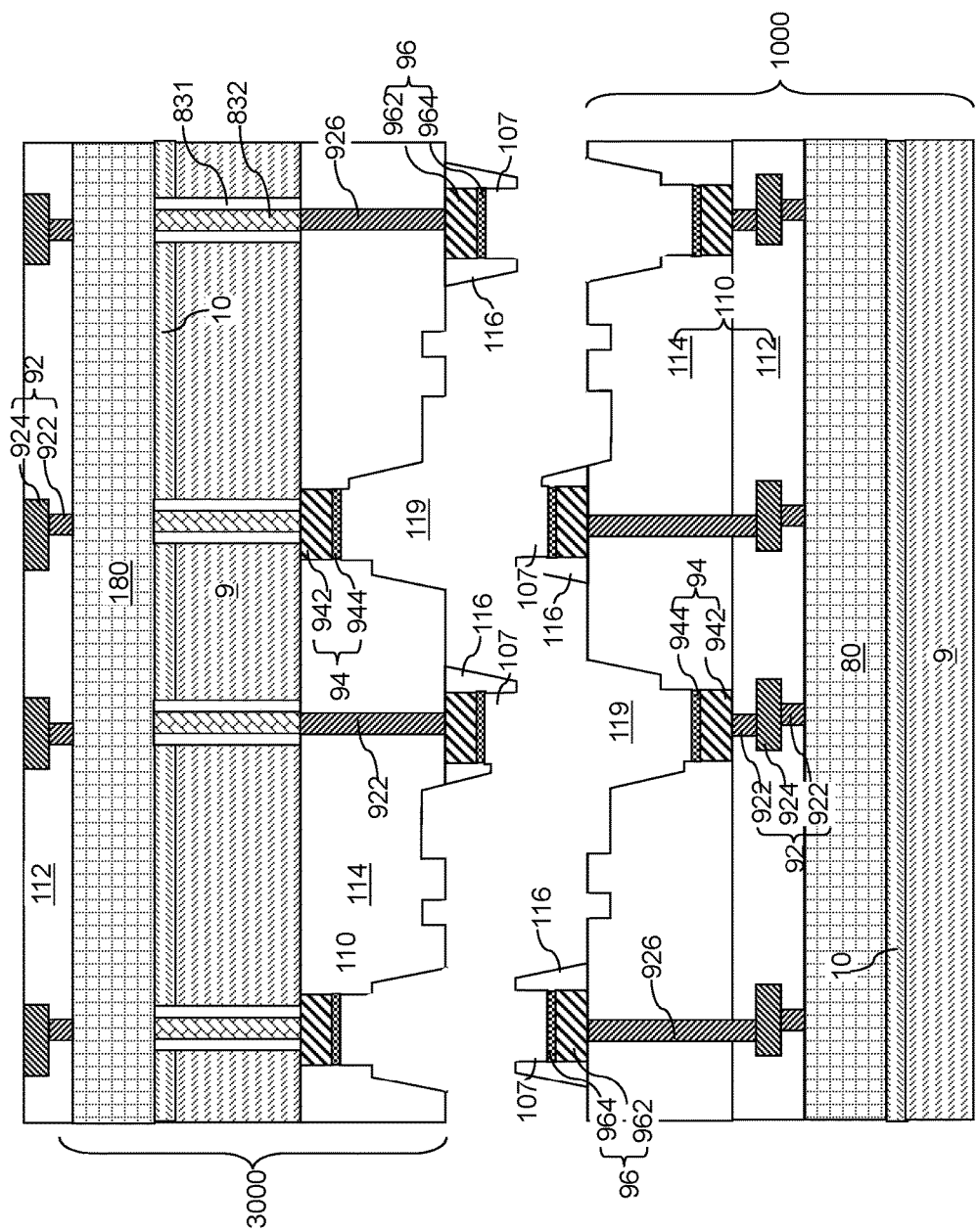
FIG. 15 is a vertical cross-sectional view of a second exemplary in-process structure for forming a bonded structure after generally aligning a first exemplary substrate and an alternate second exemplary substrate such that a first bonding-side planar surface of the first exemplary substrate faces a second bonding-side planar surface of the alternate second exemplary substrate according to a second embodiment of the present disclosure.

Referring to FIG. 15, a second exemplary in-process structure for forming a bonded structure is illustrated. In this second embodiment, the front side of the first exemplary substrate is bonded to the backside (rather than the front side) of the second exemplary substrate, and through substrate vias (e.g., through silicon vias, TSV) in the second exemplary substrate electrically connect the first semiconductor devices 80 to the second semiconductor devices 180. The first exemplary substrate 1000 comprises an optional first semiconductor material layer 10 on which the first semiconductor devices 80 are located as described above. An alternate embodiment of the second exemplary substrate 3000 comprises an optional second semiconductor material layer 10 on which the second semiconductor devices 180 are located. The second exemplary substrate 3000 embeds laterally electrically isolated through-substrate via structures 832 that provide electrically conductive paths between metal pad structures (94, 96) on the second exemplary substrate 3000 and the second semiconductor devices 180. The laterally electrically isolated through-substrate via structures 832 can be electrically isolated from the substrate semiconductor layer 9 and the second semiconductor material layer 10 of the second exemplary substrate 3000 by cylindrical insulating spacers 831.

A bonding level dielectric layer 114, mesa structures (96, 116), and the recess cavities 119 can be formed on the backside of the substrate semiconductor layer 9 (e.g., the backside of a silicon wafer which is opposite to the front side on which the second semiconductor devices 180 are located) of the second exemplary substrate 3000. The first exemplary substrate 1000 and the second exemplary substrate 3000 can be generally aligned such that a first bonding-side planar surface of the first exemplary substrate 1000 faces a second bonding-side planar surface of the second exemplary substrate 3000.

Figure 16:
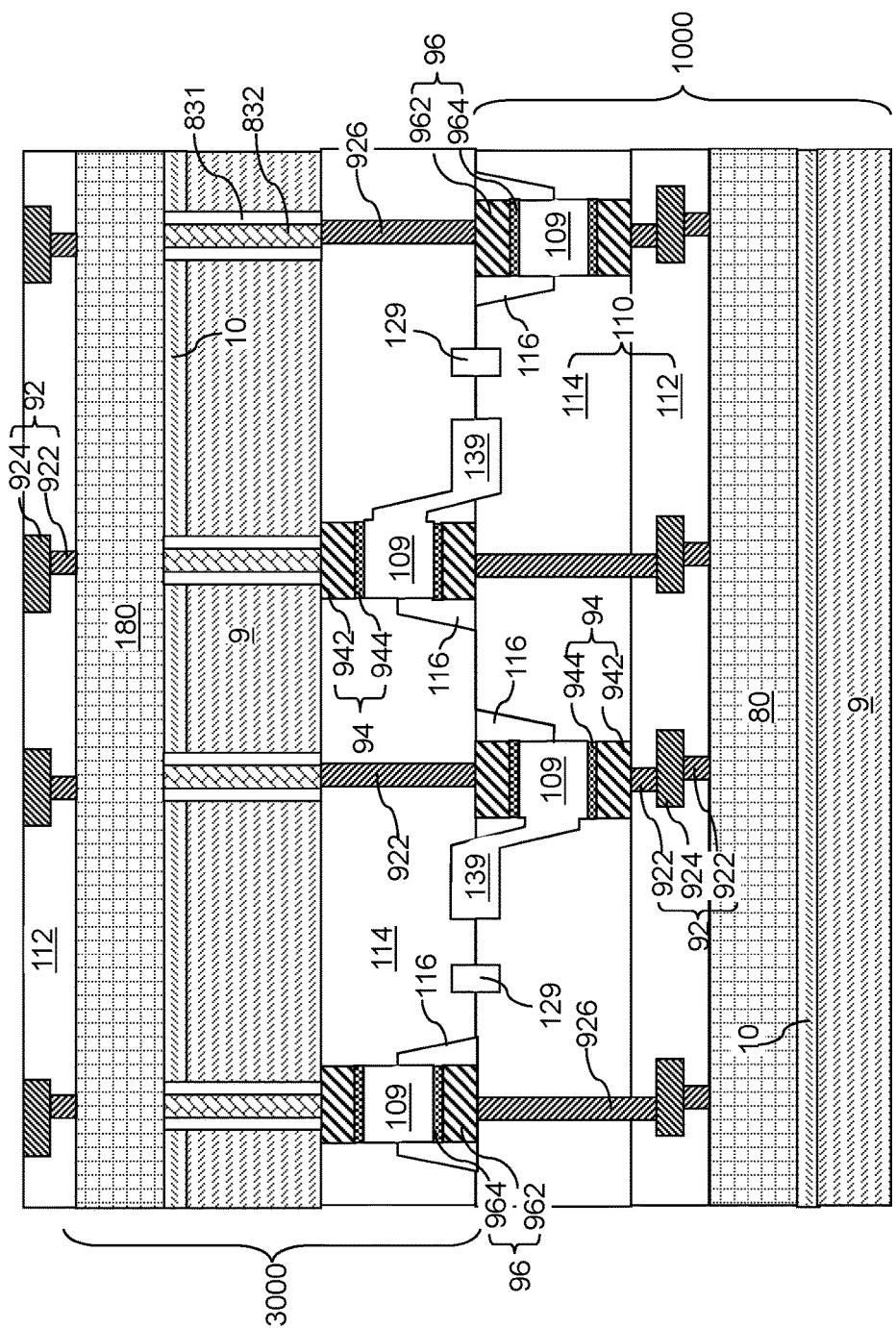
FIG. 16 is a vertical cross-sectional view of the first exemplary in-process structure for forming a bonded structure after brining into contact the first exemplary substrate and the alternate second exemplary substrate according to the second embodiment of the present disclosure.

Referring to FIG. 16, the processing steps of FIG. 13 can be performed to bring into contact the first exemplary substrate 1000 and the second exemplary substrate 3000. Opposing pair of a mesa structure (96, 116) and a recess cavity 119 have complementary interlocking patterns with gaps (109, 129, 139) formed by the recess cavities 119 and the recessed surface grooves (121, 131). The mesa structures (96, 116) on the first and second exemplary substrates (1000, 3000) slide into matching recess cavities 119 as the distance between the first and second exemplary substrates (1000, 3000) decreases, and as the first bonding-side planar surface contacts the second bonding-side planar surface. Thus, each first mesa structure (96, 116) on the first exemplary substrate 1000 slides into an alignment position by self-alignment induced by sliding of the first tapered mesa sidewalls of an insulating ring structure 116 therein over the first tapered recess sidewalls of a respective first recess cavity 119. Likewise, each second mesa structure (96, 116) on the second exemplary substrate 3000 slides into an alignment position by self-alignment induced by sliding of the second tapered mesa sidewalls of an insulating ring structure 116 therein over the second tapered recess sidewalls of a respective second recess cavity 119.

Figure 17:
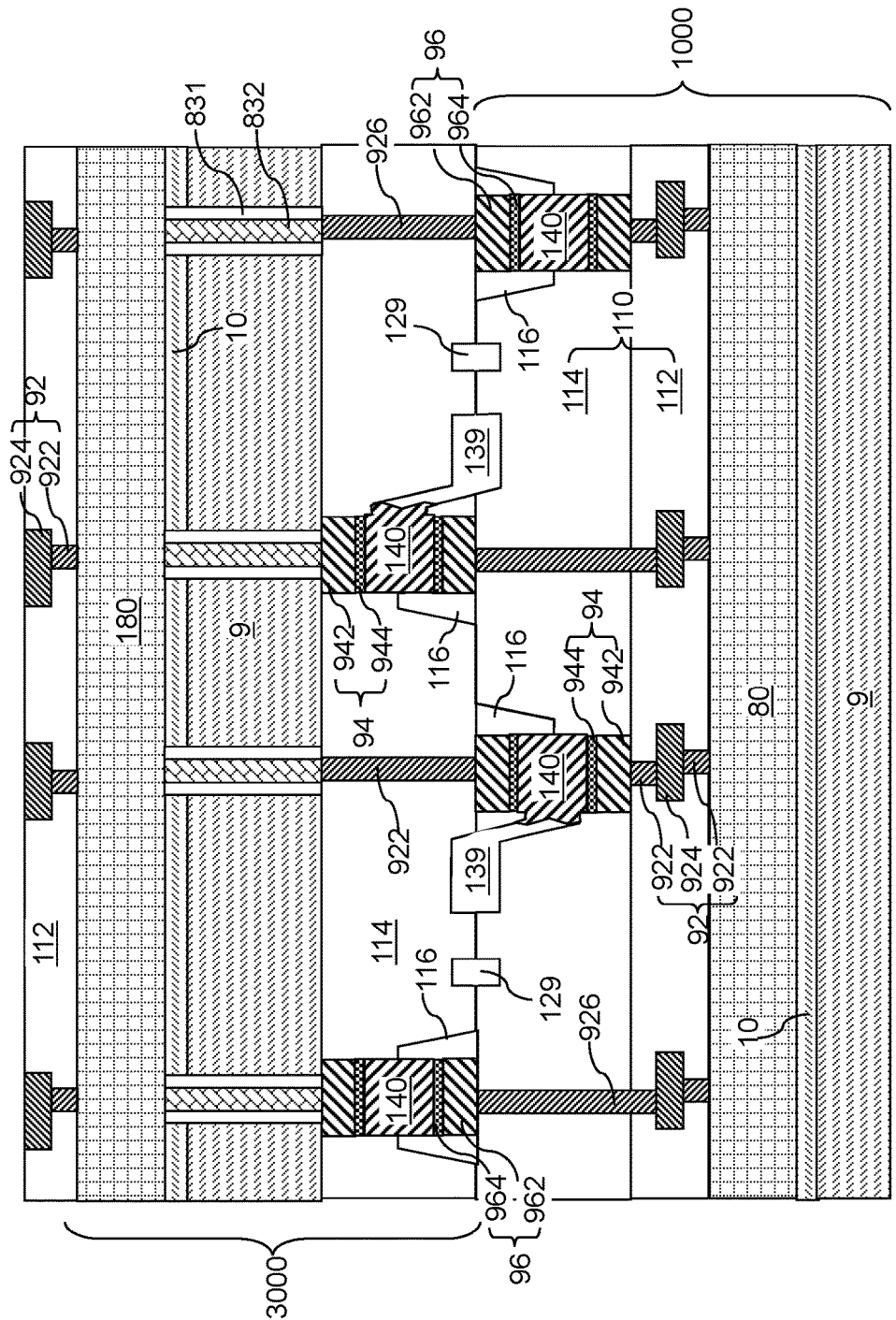
FIG. 17 is a vertical cross-sectional view of a second exemplary bonded structure after formation of metal connection pads according to the second embodiment of the present disclosure.

Referring to FIG. 17, the processing steps of FIG. 14 can be performed to form metal interconnection pads 140. A second exemplary bonded structure is provided.

Figure 18:
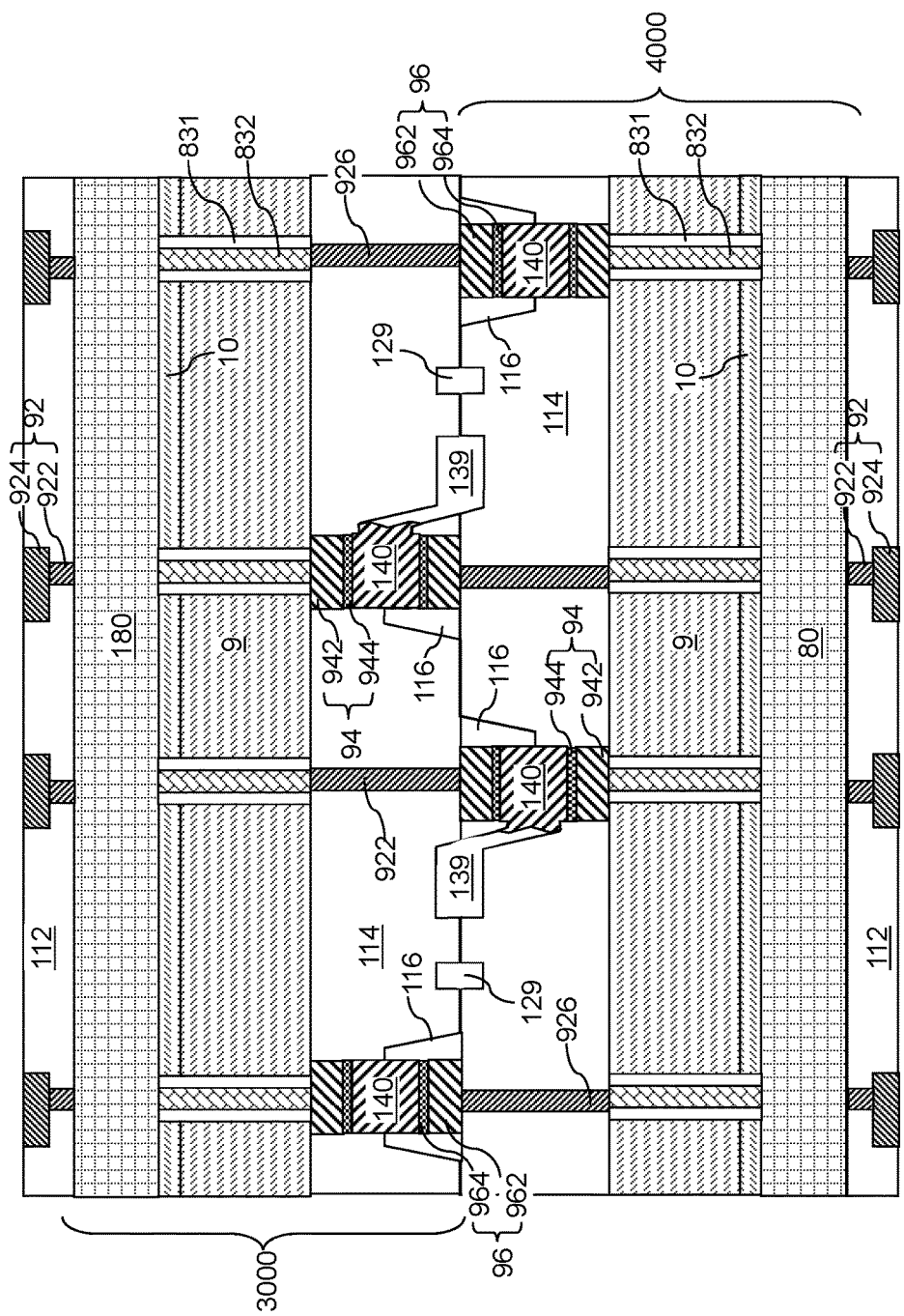
FIG. 18 is a vertical cross-sectional view of a third exemplary bonded structure after formation of metal connection pads according to a third embodiment of the present disclosure.

Referring to FIG. 18, according to a third embodiment, the backsides of the first and the second exemplary substrates are bonded to each other, and through-substrate via structures in the first and the second exemplary substrate electrically connect the first semiconductor devices 80 to the second semiconductor devices 180 on the respective substrates. In the third embodiment, the second exemplary substrate 3000 is the same as the one described above with respect to the second embodiment. However, in the third embodiment, the first exemplary substrate 4000 contains the bonding pads on the backside, as well as the through-substrate via structures 832 and the cylindrical insulating spacers 831, similar to the second exemplary substrate 3000. The first exemplary substrate 4000 and the second exemplary substrate 3000 can be bonded employing the processing steps described above with respect to the first and second embodiments.

Referring to all drawings and according to various embodiments of the present disclosure, a bonded structure is provided, which comprises: a first substrate (1000 or 4000) having a first bonding-side planar surface and a first mesa structure (96, 116) that protrudes from the first bonding-side planar surface, wherein the first mesa structure (96, 106) comprises a first metal pad structure 96 comprising a first metallic material and including a first metallic surface; a second substrate (2000 or 3000) having a second bonding-side planar surface and a first recess cavity 119 that is recessed from the second bonding-side planar surface, wherein a second metal pad structure 94 comprising a second metallic material and including a second metallic surface is located at a recessed region of the first recess cavity 119, and the first mesa structure (96, 106) is disposed within a volume of the first recess cavity 119 and the first bonding-side planar surface contacts the second bonding-side planar surface; and a metal connection pad 140 comprising a third metallic material bonded to the first metal pad structure 96 and the second metal pad structure 94, and located within a volume of the first recess cavity 119 that is not filled by the first mesa structure (96, 116).

A continuous channel cavity (129, 139) can be provided, which is free of any solid material and continuously extends from the metal connection pad 140 to a peripheral edge of at least one of the first and second bonding-side planar surfaces along an interface between the first substrate (1000 or 4000) and the second substrate (2000 or 3000). In one embodiment, the continuous channel cavity (129, 139) is bounded by at least one recessed surface groove (such as the alley groove 131) that extends along at least one sidewall of the first mesa structure (96, 116) and the first recess cavity 119 and located on at least one of the first and second bonding-side planar surfaces.

In one embodiment, the first metallic surface is more proximal to a two-dimensional plane including an interface between the first bonding-side planar surface and the second bonding-side planar surface than a tip portion of the first mesa structure (96, 106) is to the two-dimensional plane by the thickness of an upper sacrificial pad structure 97 that is removed during the manufacturing process. The second metallic surface is more distal from the two-dimensional plane than a recessed planar surface (which is formed at the processing steps of FIGS. 8A and 8B) of the first recess cavity 119 that is parallel to the two-dimensional plane is to the two-dimensional plane by the thickness of a lower sacrificial pad structure 95 that is removed during the manufacturing process. In one embodiment, the first mesa structure (96, 116) has a first tapered mesa sidewall (which is a sidewall of an insulating ring structure 116) that is not perpendicular to, and not parallel to, the two-dimensional plane, and the first recess cavity 119 has a first tapered recess sidewall that has a same taper angle as the first tapered mesa sidewall, and contacts the first tapered mesa sidewall.

In one embodiment, the first metallic material comprises a first metal nitride material, the second metallic material comprises a second metal nitride material, and the third metallic material comprises a material selected from tungsten, ruthenium, and cobalt.

In one embodiment, first semiconductor devices 80 are located over a front side of the first substrate (1000, 4000), and second semiconductor devices 180 are located over a front side of the second substrate (2000, 3000). In one embodiment, the first semiconductor devices 80 comprise an array of three-dimensional NAND memory devices, and the second semiconductor devices 180 comprise driver circuit devices for the array of three-dimensional NAND memory devices 80.

In one embodiment the first substrate (1000, 4000) comprises first interconnect level dielectric layers 112 embedding first metal interconnect structures 92 providing an electrically conductive path between the first metal pad structure 96 and one of the first semiconductor devices 80, and the second substrate (2000 or 3000) comprises second interconnect level dielectric layers 112 embedding second metal interconnect structures 92 providing an electrically conductive path between the second metal pad structure 94 and one of the second semiconductor devices 180.

In the second and third embodiments shown in FIGS. 17 and 18, the front side or a backside of the first substrate (1000, 4000) faces a backside of the second substrate (2000, 3000). A laterally electrically isolated through-substrate via structure 832 that extends from the backside to the front side of the second substrate (2000, 3000) provides an electrically conductive path between a combination of the first metal pad structure, the metal connection pad, and the second metal pad structure and the second semiconductor devices 180 located over the front side of the second semiconductor substrate (2000, 3000).

In the third embodiment illustrated in FIG. 18, the first substrate (4000) comprises a first bonding level dielectric layer 114 having the first bonding-side planar surface over the backside and the first interconnect level dielectric layers 112 over the front side. The second substrate 3000 comprises a second bonding level dielectric layer 114 having the second bonding-side planar surface over the backside and the second interconnect level dielectric layer 112 over the front another side.

In one embodiment, the first substrate (1000 or 4000) comprises a second recess cavity 119 that is recessed from the first bonding-side planar surface, wherein a third metal pad structure 94 including a third metallic surface is located at a recessed region of the second recess cavity 119. The second substrate (2000 or 3000) comprises a second mesa structure (96, 116) that protrudes from the second bonding-side planar surface, the second mesa structure (96, 116) comprises a fourth metal pad structure 96 including a fourth metallic surface, and the second mesa structure (96, 116) is disposed within a volume of the second recess cavity 119. Another metal connection pad 140 comprising the third metallic material is bonded to the third metal pad structure 94 and the fourth metal pad structure 96, and is located within a volume of the second recess cavity 119 that is not filled by the second mesa structure (96, 116).

Optionally, a thermal anneal can be performed to induce oxide-to-oxide bonding at the interface between the first bonding-side planar surface and the second bonding-side planar surface. Optionally, a dielectric passivation material can be deposited in the street channel cavities 129 into the alley channel cavities 139 by a conformal deposition process such as low pressure chemical vapor deposition. The dielectric passivation material can include, for example, silicon nitride and/or silicon oxide. Dielectric passivation material portions deposited in the street channel cavities 129 into the alley channel cavities 139 can block ingress of moisture or other contaminants into the interface region of the bonded structure.

The above described methods provide improved alignment between bonding pads on opposing substrates by sliding the mesa structures on one substrate into respective recesses in the opposing substrate. The metal connection pads 140 provide electrical connection between the various semiconductor devices in the first exemplary substrate 1000 and the various semiconductor devices in the second exemplary substrate 2000. Thus, the metal interconnection pads 140 provide mechanical bonding between the first and second exemplary substrates (1000, 2000) through adhesion to a pair of an upper metal pad structure 96 in one of the first and second exemplary substrates (1000, 2000) and a lower metal pad structure 94 in another of the first and second exemplary substrates (1000, 2000). Further, the metal interconnection pads 140 provide electrical connections between pairs of an upper metal pad structure 96 in one of the first and second exemplary substrates (1000, 2000) and a lower metal pad structure 94 in another of the first and second exemplary substrates (1000, 2000). Thus, the metal interconnection pads 140 provide the dual functions of mechanically bonding the first and second exemplary substrates (1000, 2000) and providing electrically conductive paths between the first and second exemplary substrates (1000, 2000).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded structure comprising:
    a first substrate having a first bonding-side planar surface and a first mesa structure that protrudes from the first bonding-side planar surface, wherein the first mesa structure comprises a first metal pad structure containing a first metallic material and including a first metallic surface;
    a second substrate having a second bonding-side planar surface and a first recess cavity that is recessed from the second bonding-side planar surface, wherein a second metal pad structure comprising a second metallic material and including a second metallic surface is located at a recessed region of the first recess cavity, and the first mesa structure is disposed within a volume of the first recess cavity and the first bonding-side planar surface contacts the second bonding-side planar surface;
    a metal connection pad comprising a third metallic material which is bonded to the first metal pad structure and the second metal pad structure, and which is located within a volume of the first recess cavity that is not filled by the first mesa structure; and
    a continuous channel cavity that is free of any solid material and continuously extends from the metal connection pad to a peripheral edge of at least one of the first and second bonding-side planar surfaces along an interface between the first substrate and the second substrate.

2. The bonded structure of claim 1, wherein the continuous channel cavity is bounded by at least one recessed surface groove that extends along at least one sidewall of the first mesa structure and the first recess cavity and located on at least one of the first and second bonding-side planar surfaces.

3. A bonded structure comprising:
    a first substrate having a first bonding-side planar surface and a first mesa structure that protrudes from the first bonding-side planar surface, wherein the first mesa structure comprises a first metal pad structure containing a first metallic material and including a first metallic surface;
    a second substrate having a second bonding-side planar surface and a first recess cavity that is recessed from the second bonding-side planar surface, wherein a second metal pad structure comprising a second metallic material and including a second metallic surface is located at a recessed region of the first recess cavity, and the first mesa structure is disposed within a volume of the first recess cavity and the first bonding-side planar surface contacts the second bonding-side planar surface; and a metal connection pad comprising a third metallic material which is bonded to the first metal pad structure and the second metal pad structure, and which is located within a volume of the first recess cavity that is not filled by the first mesa structure;

wherein:

the first metallic surface is more proximal to a two-dimensional plane including an interface between the first bonding-side planar surface and the second bonding-side planar surface than a tip portion of the first mesa structure is to the two-dimensional plane; and the second metallic surface is more distal from the two-dimensional plane than a recessed planar surface of the first recess cavity that is parallel to the two-dimensional plane.

4. The bonded structure of claim 3, wherein:

the first mesa structure has a first tapered mesa sidewall that is not perpendicular to, and not parallel to, the two-dimensional plane; and the first recess cavity has a first tapered recess sidewall that has a same taper angle as the first tapered mesa sidewall, and contacts the first tapered mesa sidewall.

5. A bonded structure comprising:

a first substrate having a first bonding-side planar surface and a first mesa structure that protrudes from the first bonding-side planar surface, wherein the first mesa structure comprises a first metal pad structure containing a first metallic material and including a first metallic surface;

a second substrate having a second bonding-side planar surface and a first recess cavity that is recessed from the second bonding-side planar surface, wherein a second metal pad structure comprising a second metallic material and including a second metallic surface is located at a recessed region of the first recess cavity, and the first mesa structure is disposed within a volume of the first recess cavity and the first bonding-side planar surface contacts the second bonding-side planar surface; and a metal connection pad comprising a third metallic material which is bonded to the first metal pad structure and the second metal pad structure, and which is located within a volume of the first recess cavity that is not filled by the first mesa structure;

wherein:

the first metallic material comprises a first metal nitride material;

the second metallic material comprises a second metal nitride material; and the third metallic material comprises a material selected from tungsten, ruthenium, and cobalt.

6. A bonded structure comprising:

a first substrate having a first bonding-side planar surface and a first mesa structure that protrudes from the first bonding-side planar surface, wherein the first mesa structure comprises a first metal pad structure containing a first metallic material and including a first metallic surface;

a second substrate having a second bonding-side planar surface and a first recess cavity that is recessed from the second bonding-side planar surface, wherein a second metal pad structure comprising a second metallic material and including a second metallic surface is located at a recessed region of the first recess cavity, and the first mesa structure is disposed within a volume of the first recess cavity and the first bonding-side planar surface contacts the second bonding-side planar surface; and a metal connection pad comprising a third metallic material which is bonded to the first metal pad structure and the second metal pad structure, and which is located within a volume of the first recess cavity that is not filled by the first mesa structure;

first semiconductor devices located over a front side of the first substrate; and second semiconductor devices located over a front side of the second substrate.

7. The bonded structure of claim 6, wherein:

the first semiconductor devices comprise an array of three-dimensional NAND memory devices; and the second semiconductor devices comprise driver circuit devices for the array of three-dimensional NAND memory devices.

8. The bonded structure of claim 6, further comprising:

first interconnect level dielectric layers embedding first metal interconnect structures providing an electrically conductive path between the first metal pad structure and one of the first semiconductor devices; and second interconnect level dielectric layers embedding second metal interconnect structures providing an electrically conductive path between the second metal pad structure and one of the second semiconductor devices.

9. The bonded structure of claim 6, wherein:

the front side or a backside of the first substrate faces a backside of the second substrate; and a laterally electrically isolated through-substrate via structure that extends from the backside to the front side of the second substrate provides an electrically conductive path between a combination of the first metal pad structure, the metal connection pad, and the second metal pad structure and the second semiconductor devices located over the front side of the second semiconductor substrate.

10. The bonded structure of claim 9, wherein:

the first substrate comprises a first bonding level dielectric layer having the first bonding-side planar surface over the backside and the first interconnect level dielectric layers over the front side; and the second substrate comprises a second bonding level dielectric layer having the second bonding-side planar surface over the backside and the second interconnect level dielectric layer over the front another side.

11. A bonded structure comprising:

a first substrate having a first bonding-side planar surface and a first mesa structure that protrudes from the first bonding-side planar surface, wherein the first mesa structure comprises a first metal pad structure containing a first metallic material and including a first metallic surface;

a second substrate having a second bonding-side planar surface and a first recess cavity that is recessed from the second bonding-side planar surface, wherein a second metal pad structure comprising a second metallic material and including a second metallic surface is located at a recessed region of the first recess cavity, and the first mesa structure is disposed within a volume of the first recess cavity and the first bonding-side planar surface contacts the second bonding-side planar surface; and a metal connection pad comprising a third metallic material which is bonded to the first metal pad structure and the second metal pad structure, and which is located within a volume of the first recess cavity that is not filled by the first mesa structure;

wherein:
the first substrate comprises a second recess cavity that is recessed from the first bonding-side planar surface, wherein a third metal pad structure including a third metallic surface is located at a recessed region of the second recess cavity;

the second substrate comprises a second mesa structure that protrudes from the second bonding-side planar surface, wherein the second mesa structure comprises a fourth metal pad structure including a fourth metallic surface, and the second mesa structure is disposed within a volume of the second recess cavity; and another metal connection pad comprising the third metallic material is bonded to the third metal pad structure and the fourth metal pad structure, and is located within a volume of the second recess cavity that is not filled by the second mesa structure.

* * * * *